United States Patent
Bang et al.

(10) Patent No.: US 11,848,342 B2
(45) Date of Patent: Dec. 19, 2023

(54) IMAGE SENSOR INCLUDING A FENCE PATTERN

(71) Applicant: SAMSUNG ELECTRONICS CO., LTD., Suwon-si (KR)

(72) Inventors: Sunyoung Bang, Suwon-si (KR); Seungjoo Nah, Gwangju (KR); Hoemin Jeong, Suwon-si (KR); Heegeun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 17/218,662

(22) Filed: Mar. 31, 2021

(65) Prior Publication Data

US 2022/0037385 A1    Feb. 3, 2022

(30) Foreign Application Priority Data

Jul. 29, 2020 (KP) .................. 10-2020-0094782

(51) Int. Cl.
*H01L 27/146* (2006.01)

(52) U.S. Cl.
CPC .. *H01L 27/14621* (2013.01); *H01L 27/14627* (2013.01)

(58) Field of Classification Search
CPC ......... H01L 27/14621; H01L 27/14627; H01L 27/14645; H01L 27/14623; H01L 27/1463; H01L 27/1464; H01L 27/14636; H01L 27/14605; H01L 27/14625
See application file for complete search history.

(56) References Cited

U.S. PATENT DOCUMENTS

| | | | |
|---|---|---|---|
| 8,242,548 B2 | 8/2012 | Takizawa | |
| 8,537,255 B2 | 9/2013 | Lee et al. | |
| 8,736,727 B2 | 5/2014 | Ando | |
| 10,091,439 B2 | 10/2018 | Hogasten et al. | |
| 10,229,950 B2 * | 3/2019 | Lee | H01L 27/14609 |
| 10,462,431 B2 * | 10/2019 | Huang | H01L 27/14627 |
| 10,497,736 B2 | 12/2019 | Han | |
| 10,608,033 B2 * | 3/2020 | Lee | H01L 27/14627 |
| 10,636,826 B2 * | 4/2020 | Nakamoto | H01L 27/14685 |
| 10,950,642 B2 * | 3/2021 | Lee | H01L 27/14603 |
| 2006/0223212 A1 * | 10/2006 | Jang | H01L 27/14687 |
| | | | 257/E27.151 |
| 2011/0042766 A1 * | 2/2011 | Kurokawa | H01L 31/02164 |
| | | | 257/E31.127 |

(Continued)

*Primary Examiner* — Jami Valentine Miller
*Assistant Examiner* — Pratiksha Jayant Lohakare
(74) *Attorney, Agent, or Firm* — F. Chau & Associates, LLC

(57) ABSTRACT

An image sensor includes: a substrate having a first surface and a second surface that are opposite to each other; a plurality of color filters on the substrate; a fence pattern between adjacent color filters of the plurality of color filters; and a protective layer between the substrate and the plurality of color filters, wherein the protective layer covers the fence pattern. The fence pattern includes: a first fence pattern having a first bottom surface and a first top surface that are opposite to each other; and a second fence pattern on the first top surface of the first fence pattern. A width at the first bottom surface of the first fence pattern is less than a width of the second fence pattern, and the protective layer covers a sidewall of the first fence pattern.

20 Claims, 13 Drawing Sheets

(56) References Cited

U.S. PATENT DOCUMENTS

| | | | | |
|---|---|---|---|---|
| 2016/0276394 | A1* | 9/2016 | Chou | H01L 27/14636 |
| 2016/0307942 | A1* | 10/2016 | Cheng | H01L 27/14623 |
| 2016/0358970 | A1* | 12/2016 | Ting | H01L 27/14643 |
| 2017/0098673 | A1* | 4/2017 | Nomura | H01L 27/14623 |
| 2018/0277582 | A1* | 9/2018 | Cheng | H01L 27/14627 |
| 2019/0110739 | A1* | 4/2019 | Tey | G06T 7/0012 |
| 2019/0148450 | A1* | 5/2019 | Wei | H01L 27/14649 |
| | | | | 257/184 |
| 2019/0221596 | A1* | 7/2019 | Oota | G09F 9/00 |
| 2019/0296060 | A1* | 9/2019 | Oh | H04N 25/59 |
| 2019/0386049 | A1* | 12/2019 | Jung | H01L 27/1463 |
| 2020/0083268 | A1 | 3/2020 | Kim et al. | |
| 2021/0104565 | A1* | 4/2021 | Yang | H01L 27/14645 |

\* cited by examiner

IMAGE SENSOR INCLUDING A FENCE PATTERN

CROSS-REFERENCE TO RELATED APPLICATION

This U.S. nonprovisional application claims priority under 35 U.S.C. § 119 to Korean Patent Application No. 10-2020-0094782 filed on Jul. 29, 2020 in the Korean Intellectual Property Office, the disclosure of which is incorporated by reference herein in its entirety.

TECHNICAL FIELD

The present inventive concept relates to an image sensor, and more particularly, to an image sensor including a fence pattern.

DISCUSSION OF THE RELATED ART

Generally, an image sensor is a device that converts optical images into electrical signals. An image sensor can be classified into a charge coupled device (CCD) type and a complementary metal oxide semiconductor (CMOS) type. A CMOS type image sensor is abbreviated to CIS (CMOS image sensor). Typically, the CIS has a plurality pixels arranged on a plane. Each of the pixels includes a photodiode. The photodiode serves to convert incident light into electrical signals.

SUMMARY

According to an exemplary embodiment of the present inventive concept, an image sensor includes: a substrate having a first surface and a second surface that are opposite to each other; a plurality of color filters on the substrate; a fence pattern between adjacent color filters of the plurality of color filters; and a protective layer between the substrate and the plurality of color filters, wherein the protective layer covers the fence pattern. The fence pattern includes: a first fence pattern having a first bottom surface and a first top surface that are opposite to each other; and a second fence pattern on the first top surface of the first fence pattern. A width at the first bottom surface of the first fence pattern is less than a width of the second fence pattern, and the protective layer covers a sidewall of the first fence pattern.

According to an exemplary embodiment of the present inventive concept, an image sensor includes: a substrate having a first surface and a second surface that are opposite to each other, wherein the substrate includes a plurality of photoelectric conversion regions; a separation pattern in the substrate and between the photoelectric conversion regions; a plurality of color filters on the substrate; and a fence pattern on the separation pattern and between adjacent color filters of the plurality of color filters. The fence pattern includes: a first fence pattern having a bottom surface and a top surface that are opposite to each other; and a second fence pattern on the first fence pattern. A width at the bottom surface of the first fence pattern is less than a width at the top surface of the first fence pattern, and a maximum width of the second fence pattern is about 100% to about 102% of a minimum width of the second fence pattern.

According to an exemplary embodiment of the present inventive concept, an image sensor includes: a substrate having a first surface and a second surface that are opposite to each other, wherein the substrate includes therein a plurality of photoelectric conversion regions; a separation pattern in the substrate and between adjacent photoelectric conversion regions of the plurality of photoelectric conversion regions; a plurality of color filters on the substrate; a fence pattern on the separation pattern and between adjacent color filters of the plurality of color filters, wherein the fence pattern includes: a first fence pattern having a first bottom surface and a first top surface that are opposite to each other; and a second fence pattern on the first top surface of the first fence pattern, wherein a width at the first bottom surface of the first fence pattern is less than a width at the first top surface of the first fence pattern; a dielectric layer between the substrate and the color filters and between the fence pattern and the separation pattern; a protective layer between the dielectric layer and the color filters, wherein the protective layer covers a sidewall of the first fence pattern, a sidewall of the second fence pattern, and a top surface of the second fence pattern; a microlens layer on the color filters and the fence pattern; a gate pattern on the second surface of the substrate; and a wiring layer on the second surface of the substrate, wherein the wiring layer includes a lower dielectric layer and a wiring structure, wherein the lower dielectric layer covers the gate pattern, and wherein the wiring structure is in the lower dielectric layer.

DETAILED DESCRIPTION OF EMBODIMENTS

Figure 1:
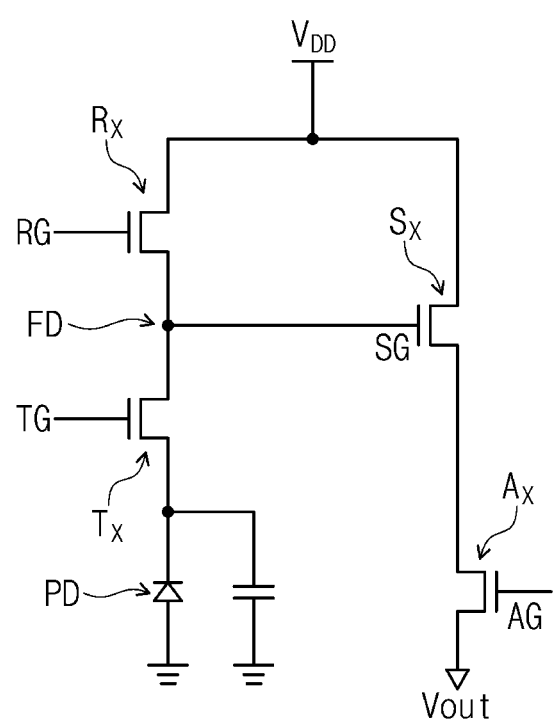
FIG. 1 illustrates a circuit diagram of a pixel of an image sensor according to an exemplary embodiment of the present inventive concept.

In this description, like reference numerals may indicate like components. The following will now describe an image sensor according to an exemplary embodiment of the present inventive concept.

FIG. 1 illustrates a circuit diagram of a pixel of an image sensor according to an exemplary embodiment of the present inventive concept.

Referring to FIG. 1, each of pixels of an image sensor may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may respectively include a transfer gate TG, a source follower gate SG, a reset gate RG, and a selection gate AG.

The photoelectric conversion region PD may be a photodiode that includes tin n-type impurity region and a p-type impurity region. A floating diffusion region FD may serve as a drain of the transfer transistor Tx. The floating diffusion region FD may also serve as a source of the reset transistor Rx. The floating diffusion region FD may be electrically connected to the source follower gate SG of the source follower transistor Sx. The source follower transistor Sx may be connected to the selection transistor Ax.

An operation of the image sensor will be explained below with reference to FIG. 1. In addition, a power voltage VDD may be applied to a drain of the reset transistor Rx and a drain of the source follower transistor Sx under a light-blocked state, during which the reset transistor Rx may be turned on to discharge charges that remain on the floating diffusion region FD. Thereafter, when the reset transistor Rx is turned off and external light is incident on the photoelectric conversion region PD, electron-hole pairs may be generated from the photoelectric conversion region PD. Holes may be transferred to and accumulated on a p-type impurity region of the photoelectric conversion region PD, and electrons may be transferred to and accumulated on an n-type impurity region of the photoelectric conversion region PD. When the transfer transistor Tx is turned on, charges such as electrons and hole may be transferred to and accumulated on the floating diffusion region FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A connection line may be electrically connected to one or more of the transfer gate TG, the source follower gate SG, the reset gate RG, and the selection gate AG. The connection line may be configured to apply the power voltage VDD to the drain of the reset transistor Rx or the drain of the source follower transistor Sx. The connection line may include a column line connected to the selection transistor Ax. The connection line may be a first conductive structure 830 which will be discussed below in FIGS. 2B and 3B.

FIG. 1 shows by way of example a pixel that includes one photoelectric conversion region PD and four transistors Tx, Rx, Ax, and Sx, but the present inventive concept is not limited thereto. For example, the pixel may be provided in plural, and neighboring pixels may share at least one of the reset transistor Rx, the source follower transistor Sx, or the selection transistor Ax. Therefore, the image sensor may increase in integration.

Figure 2A:
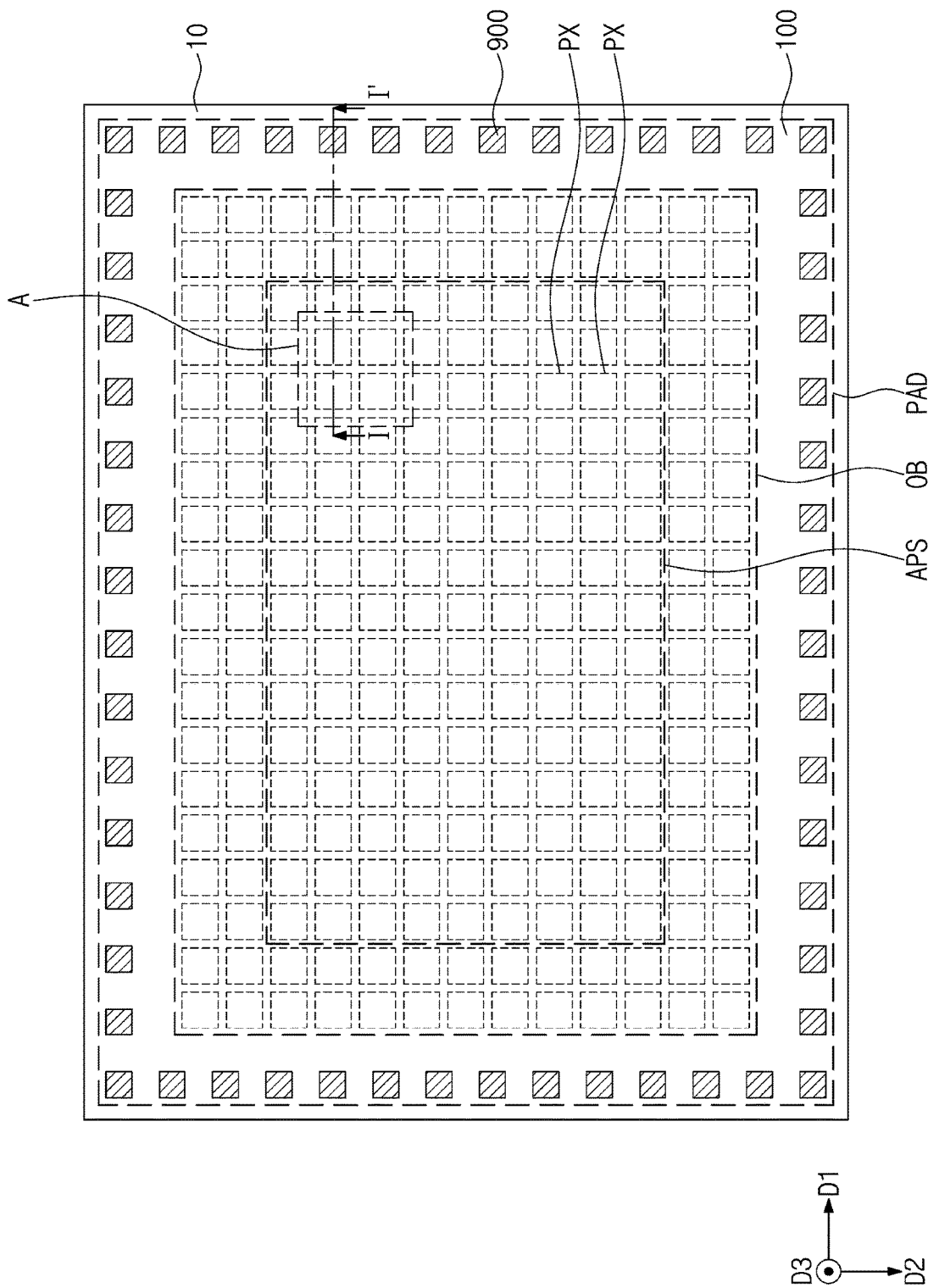
FIG. 2A illustrates a plan view of an image sensor according to an exemplary embodiment of the present inventive concept.
Figure 2B:
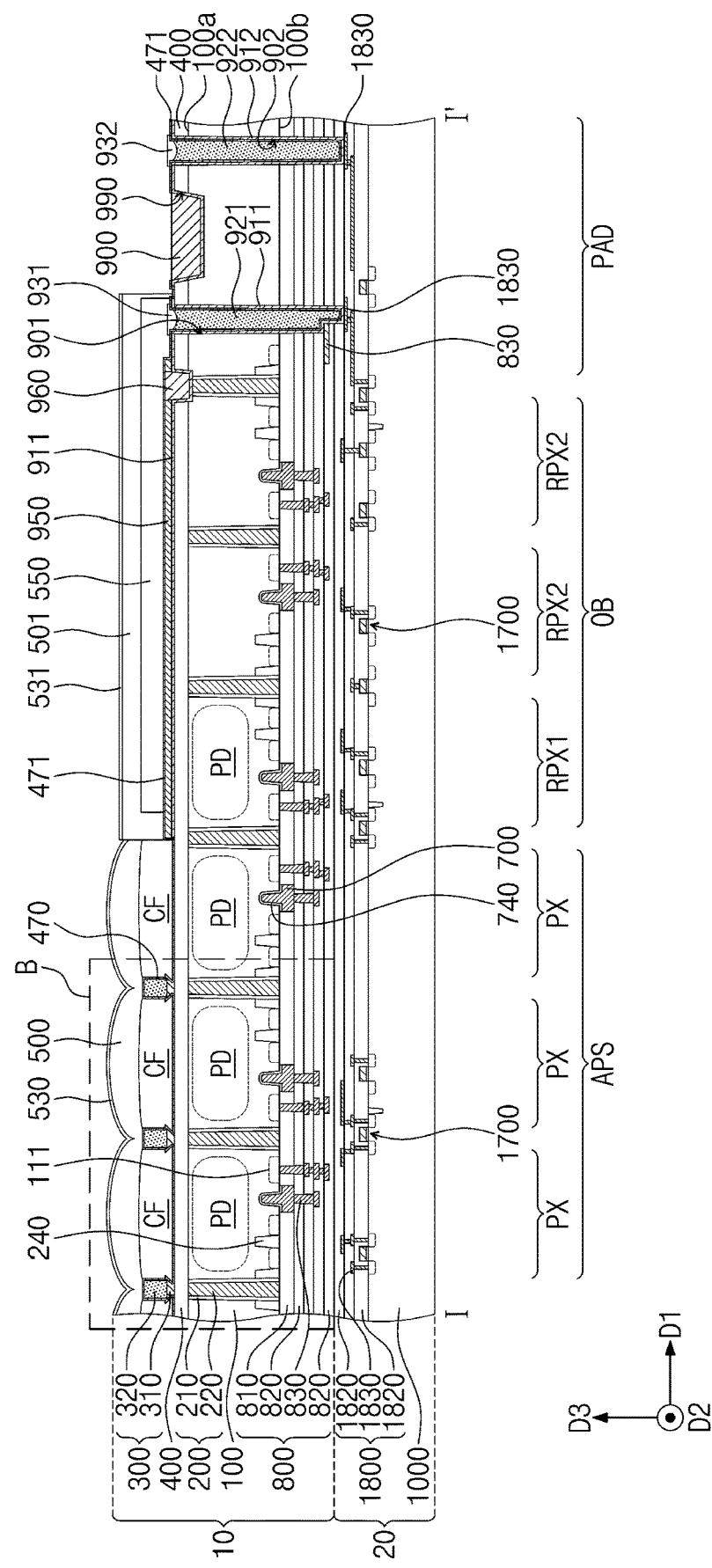
FIG. 2B illustrates a cross-sectional view taken along line I-I' of FIG. 2A.

FIG. 2A illustrates a plan view of an image sensor according to an exemplary embodiment of the present inventive concept. FIG. 2B illustrates a cross-sectional view taken along line I-I' of FIG. 2A.

Referring to FIGS. 2A and 2B, an image sensor may include a sensor chip 10. The sensor chip 10 may include a first substrate 100, a first wiring layer 800, a dielectric layer 400, a protective layer 470, color filters CF, a fence pattern 300, and a microlens layer 500.

When viewed in plan, the first substrate 100 may include a pixel array region APS, an optical black region OB, and a pad region PAD. When viewed in plan, the pixel array region APS may be disposed on a central portion of the first substrate 100. The pixel array region APS may include a plurality of pixel regions PX. The pixels discussed with reference to FIG. 1 may be formed on corresponding pixel regions PX of the first substrate 100. For example, components of the pixels may be provided on corresponding pixel regions PX. The pixel regions PX may output photoelectric signals based on incident light. The pixel regions PX may be arranged in rows and columns on a plane. The rows may be parallel to a first direction D1. The columns may be parallel to a second direction D2. In this description, the first direction D1 may be parallel to a first surface 100a of the first substrate 100. The second direction D2 may be parallel to the first surface 100a of the first substrate 100 and may be different from the first direction D1. For example, the second direction D2 may be substantially perpendicular to the first direction D1. A third direction D3 may intersect the first and second directions D1 and D2. For example, the third direction D3 may be substantially perpendicular to the first surface 100a of the first substrate 100.

For example, the pad region PAD may be provided on an edge portion of the first substrate 100 and may at least partially surround the pixel array region APS. Pad terminals 900 may be provided on the pad region PAD. The pad terminals 900 may externally output electrical signals that are generated from the pixel regions PX. In addition, external electrical signals or voltages may be transferred through the pad terminals 900 to the pixel regions PX. As the pad region PAD is disposed on the edge portion of the first substrate 100, the pad terminals 900 may be coupled to the outside. For brevity of description, the following will discuss a single pad terminal 900. The optical black region OB will be discussed below. The following description will focus on the pixel array region APS of the sensor chip 10 included in the image sensor.

Figure 3A:
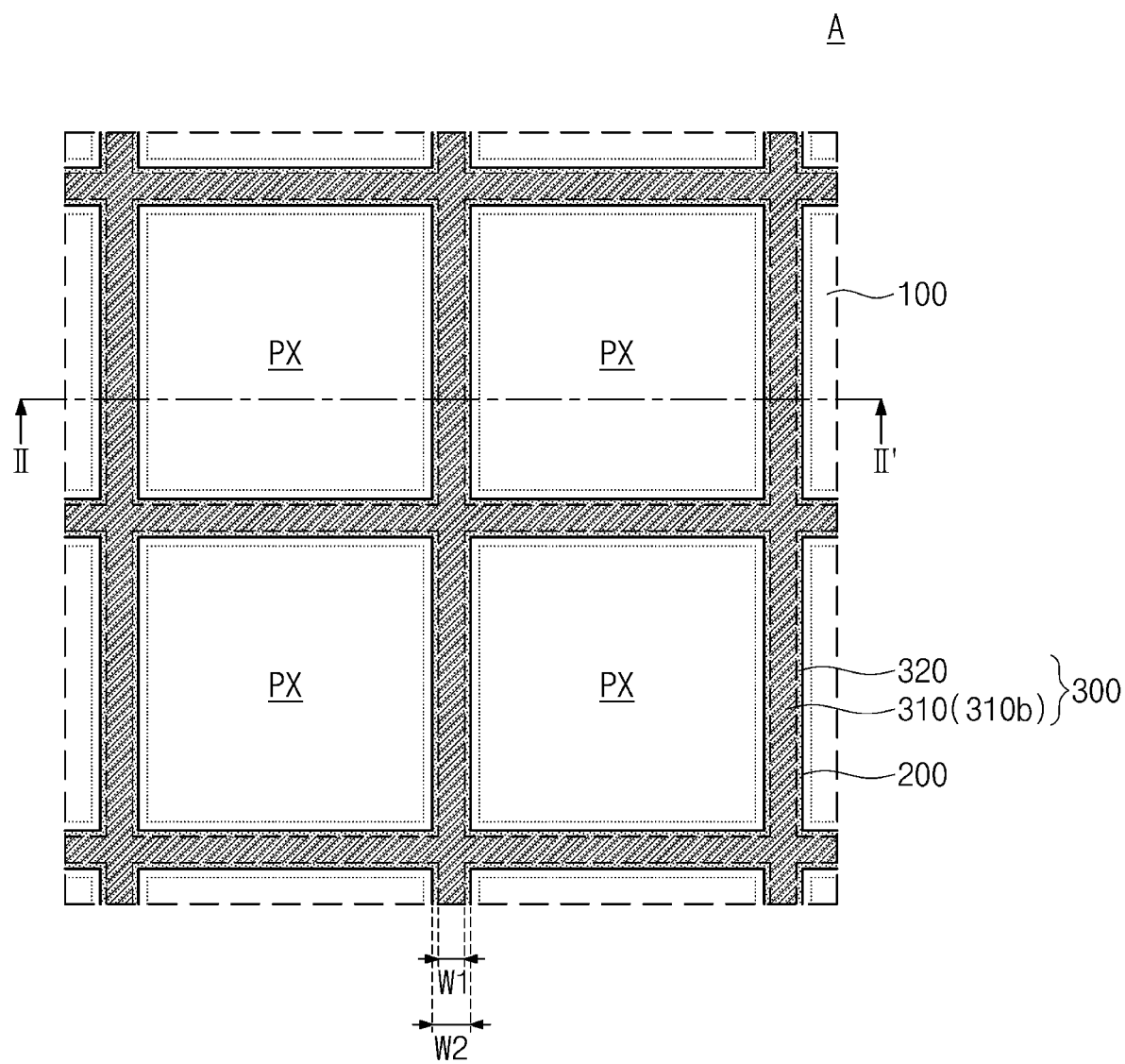
FIG. 3A illustrates an enlarged plan view of section A in FIG. 2A, showing a pixel array region of an image sensor according to an exemplary embodiment of the present inventive concept.
Figure 3A:
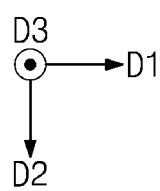
Figure 3B:
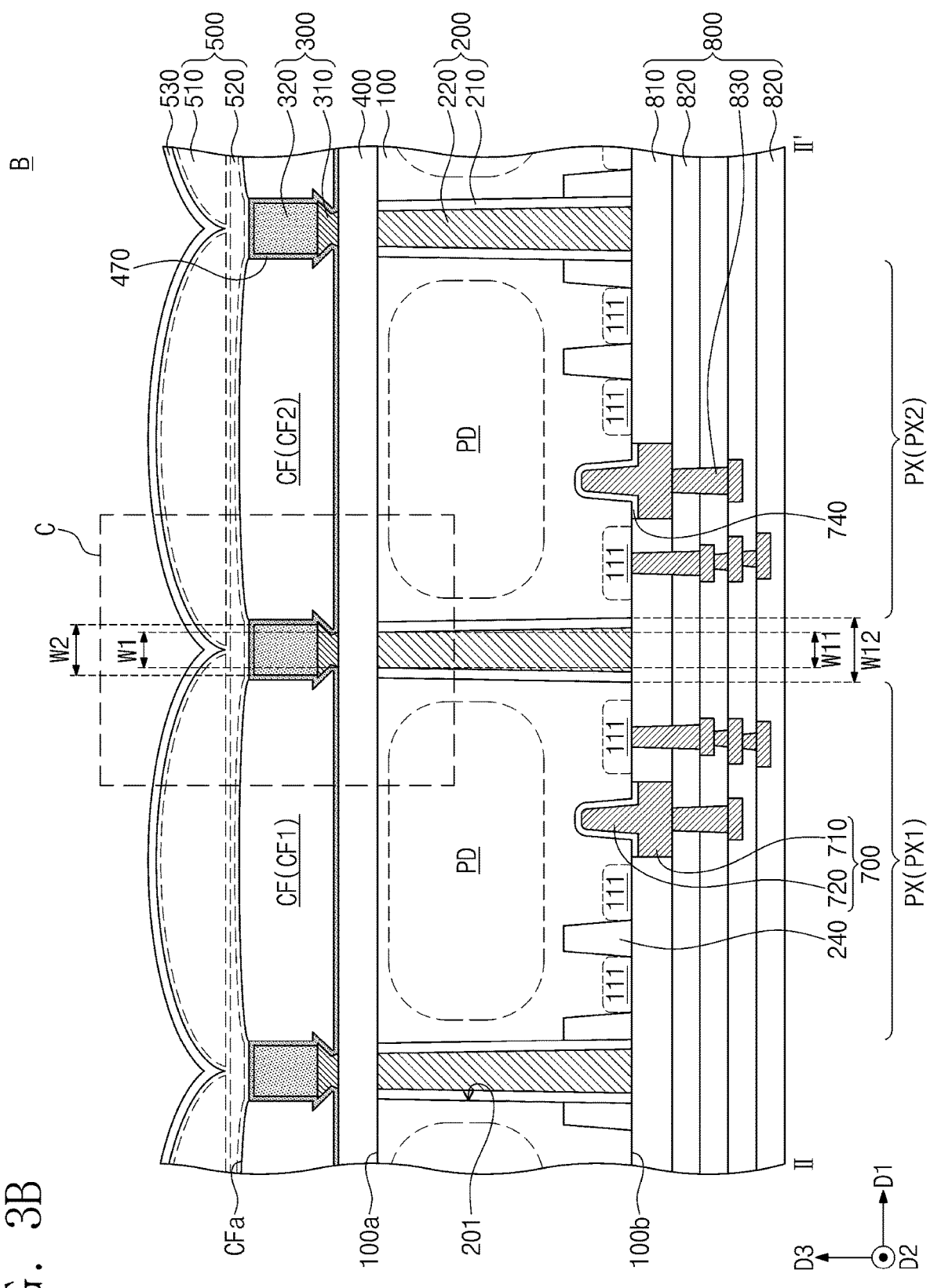
FIG. 3B illustrates an enlarged cross-sectional view of section B of FIG. 2B taken along line II-II' of FIG. 3A.
Figure 3C:
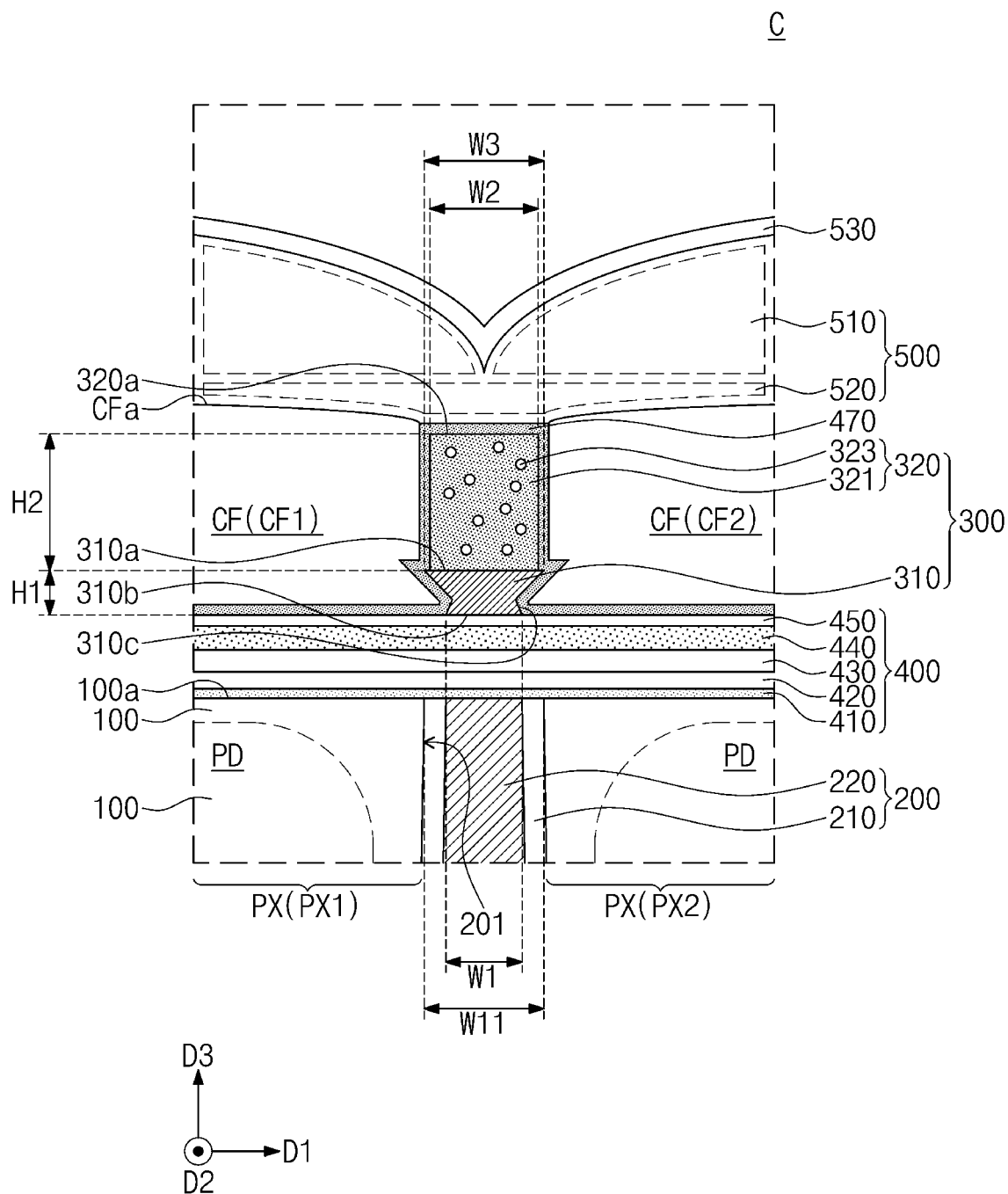
FIG. 3C illustrates an enlarged view of section C in FIG. 3B.

FIG. 3A illustrates an enlarged plan view of section A in FIG. 2A, showing a pixel array region of an image sensor according to an exemplary embodiment of the present inventive concept. FIG. 3B illustrates an enlarged cross-sectional view of section B in FIG. 2B taken along line II-II' of FIG. 3A. FIG. 3C illustrates an enlarged view of section C in FIG. 3B. A duplicate description will be omitted below.

Referring to FIGS. 3A, 3B, and 3C, an image sensor may include a first substrate 100, a first wiring layer 800, a separation pattern 200, a dielectric layer 400, color filters CF, a fence pattern 300, and a microlens layer 500.

The first substrate 100 may have a first surface 100a and a second surface 100b that are opposite to each other. For example, the first surface 100a of the first substrate 100 may be a rear surface, and the second surface 100b of the first substrate 100 may be a front surface. The first substrate 100 may receive light on the first surface 100a. For example, the first substrate 100 may be a semiconductor substrate or a silicon-on-insulator (SOI) substrate. The semiconductor substrate may be, for example, a silicon substrate, a germanium substrate, or a silicon-germanium substrate. The first substrate 100 may further include a III-group element. The III-group element may be a first conductivity type impurity. The first substrate 100 may include first conductivity type impurities, thereby having a first conductivity type. For example, the first conductivity type impurities may include p-type impurities, such as one or more of aluminum (Al), boron (B), indium (In), and/or gallium (Ga). The first substrate 100 may have pixel regions PX. As shown in FIG. 3B, the pixel regions PX may include a first pixel region PX1 and a second pixel region PX2 that are adjacent to each other.

The first substrate 100 may include photoelectric conversion regions PD. The photoelectric conversion regions PD may be interposed between the first and second surfaces 100a and 100b of the first substrate 100. In the first substrate 100, the photoelectric conversion regions PD may be provided on corresponding pixel regions PX. The photoelectric conversion regions PD may have the same function and role as those of the photoelectric conversion region PD shown in FIG. 1. For example, the photoelectric conversion regions PD may each further include a V-group element. The V-group element may be a second conductivity type impurity. The photoelectric conversion regions PD may be areas where the first substrate 100 is doped with second conductivity type impurities. The second conductivity type impurities may have a conductivity type opposite to that of the first conductivity type impurities. The second conductivity type impurities may include n-type impurities, such as one or more of phosphorus, arsenic, bismuth, and/or antimony. For example, the photoelectric conversion regions PD may be disposed below the first surface 100a of the first substrate 100.

The separation pattern 200 may be provided in the first substrate 100 and may form the pixel regions PX. For example, the separation pattern 200 may be provided between the pixel regions PX of the first substrate 100. The separation pattern 200 may be a pixel separation pattern. The separation pattern 200 may be provided in a first trench 201, and the first trench 201 may extend from the second surface 100b of the first substrate 100. For example, the separation pattern 200 may be a deep trench isolation (DTI) layer. The separation pattern 200 may penetrate the first surface 100a of the first substrate 100. As shown in FIG. 3B, a width W11 at a top surface of the separation pattern 200 may be less than a width W12 at a bottom surface of the separation pattern 200. For example, the top surface of the separation pattern 200 may be coplanar with the first surface 100a of the first substrate 100. The bottom surface of the separation pattern 200 may stand opposite to the top surface of the separation pattern 200. The separation pattern 200 may include a first separation pattern 210 and a second separation pattern 220. The first separation pattern 210 may be provided along a sidewall of the first trench 201. For example, the first separation pattern 210 may include one or more of a silicon-based dielectric material (e.g., silicon nitride, silicon oxide, and/or silicon oxynitride) and/or a high-k dielectric material (e.g., hafnium oxide and/or aluminum oxide). For example, the first separation pattern 210 may include a plurality of layers, and the plurality of layers may include different materials from each other. However, the present inventive concept is not limited thereto, and for example, the first separation pattern 210 may be a single layer. The first separation pattern 210 may have a refractive index less than that of the first substrate 100. Accordingly, crosstalk may be prevented or reduced between the pixel regions PX of the first substrate 100.

The second separation pattern 220 may be provided in the first separation pattern 210. The first separation pattern 210 may be interposed between the second separation pattern 220 and the first substrate 100. The first separation pattern 210 may separate the second separation pattern 220 from the first substrate 100. Therefore, when the image sensor operates, the second separation pattern 220 may be electrically separated from the first substrate 100. The second separation pattern 220 may include a crystalline semiconductor material, for example, polysilicon. For example, the second separation pattern 220 may further include dopants, and the dopants may include first conductivity type impurities or second conductivity type impurities. For example, the second separation pattern 220 may include doped polysilicon.

The color filters CF are disposed on the first surface 100a of the first substrate 100 in corresponding pixel regions PX. For example, the color filters CF may be provided on positions that correspond to those of the photoelectric, conversion regions PD. Each of the color filters CF may include one of red, blue, or green filters. The color filters CF may constitute a color filter array. For example, when viewed in plan, the color filters CF may form an array along the first and second directions D1 and D2.

The fence pattern 300 may be disposed on the separation pattern 200. For example, when viewed in plan, the fence pattern 300 may overlap the separation pattern 200. The fence pattern 300 mays be interposed between two neighboring color filters CF, thereby separating the color filters CF. For example, the fence pattern 300 may physically and optically separate a plurality of color filters CF from each other.

When viewed in plan, the fence pattern 300 may overlap the separation pattern 200. The fence pattern 300 may have a shape that corresponds to that of the separation pattern 200. For example, the fence pattern 300 may have a grid shape as shown in FIG. 3A. When viewed in plan, the fence pattern 300 may surround each of the pixel regions PX. For example, the fence pattern 300 may surround each of the color filters CF. The fence pattern 300 may include first portions and second portions. The first portions may extend parallel to the first direction D1 and may be spaced apart from each other in the second direction D2. Each of the second portions may extend parallel to the second direction D2. The second portions may be spaced apart from each other in the first direction D1. The second portions may be connected to the first portions.

As shown in FIG. 3B, the fence pattern 300 may include a first fence pattern 310 and a second fence pattern 320. The first fence pattern 310 may be disposed between the separation pattern 200 and the second fence pattern 320. For example, the first fence pattern 310 may include a conductive material, such as one or more of metal and/or metal nitride. For example, the first fence pattern 310 may include one or more of titanium and titanium nitride.

The second fence pattern 320 may be disposed on the first fence pattern 310. The second fence pattern 320 may include a different material from that of the first fence pattern 310. For example, the second fence pattern 320 may include an organic material. The second fence pattern 320 may include a material whose refractive index is low and may have dielectric characteristics. For example, the second fence pattern 320 may have a refractive index lower than that of the substrate 100; however, the present inventive concept is not limited thereto. The second fence pattern 320 may have, for example, a rectangular cross-section. A width at a bottom surface of the fence pattern 300 may be less than a width at a top surface of the fence pattern 300. Therefore, the first substrate 100 may receive an increased amount of incident light. The fence pattern 300 will be further discussed below with reference to FIG. 3C.

The dielectric layer 400 may be interposed between the first substrate 100 and the color filters CF and between the separation pattern 200 and the fence pattern 300. The dielectric layer 400 may cover the first surface 100a of the first substrate 100 and the top surface of the separation pattern 200. For example, the dielectric layer 400 may be a backside dielectric layer. For example, the dielectric layer 400 may include a bottom antireflective coating (BARC) layer. The dielectric layer 400 may include a plurality of layers, and the plurality of layers may have different functions from each other. However, the present inventive concept is not limited thereto. For example, the dielectric layer 400 may be a single layer.

The following will describe in detail the dielectric layer 400, the color filters CF, the protective layer 470, and the microlens layer 500 according to an exemplary embodiment of the present inventive concept.

Referring to FIGS. 3B and 3C, the color filters CF may be provided on the first surface 100a of the first substrate 100 and may be placed laterally adjacent to each other. The color filters CF may include a first color filter CF1 and a second color filter CF2 that are adjacent to each other. The first color filter CF1 and the second color filter CF2 may respectively correspond to the first pixel region PX1 and the second pixel region PX2. For example, the first color filter CF1 and the second color filer CF2 may be respectively provided on the first pixel region PX1 and the second pixel region PX2. The second color filter CF2 may be of a different type from that of the first color filter CF1. For example, the second color filter CF2 may be a different color from that of the first color filter CF1. For example, the second color filter CF2 may be one of red, blue, or green filters, and the first color filter CF1 may be one of the remaining of red, blue, or green filters. For another example, the second color filter CF2 may be of the same type as that of the first color filter CF1.

On the dielectric layer 400, the fence pattern 300 may be interposed between the color filters CF. The fence pattern 300 may vertically overlap the separation pattern 200. In this description, the term "vertical" may mean "parallel to the third direction D3 or to a direction opposite to the third direction D3." The first surface 100a of the first substrate 100 may receive external light that passes through the microlens layer 500 and the color filters CF. In this case, the light may be incident to the first surface 100a of the first substrate 100. For example, the light may be incident in a direction inclined to the first surface 100a. The fence pattern 300 may prevent light from being transferred from the first color filter CF1 corresponding to the first pixel region PX1 toward the photoelectric conversion region PD of the second pixel region PX2. Likewise, the fence pattern 300 may prevent light from being transferred from the second color filter CF2 corresponding to the second pixel region PX2 toward the photoelectric conversion region PD of the first pixel region PX1. Accordingly, a crosstalk may be reduced between the pixel regions PX of the image sensor.

The fence pattern 300 may include the first fence pattern 310 and the second fence pattern 320. The first fence pattern 310 may have a first bottom surface 310b, a first sidewall 310c, and a first top surface 310a. The first bottom surface 310b of the first fence pattern 310 may correspond to the bottom surface of the fence pattern 300. The first top surface 310a of the first fence pattern 310 may be opposite to the first bottom surface 310b of the first fence pattern 310. The first sidewall 310c may connect an edge of the first top surface 310a to an edge of the first bottom surface 310b. The first sidewall 310c may be inclined to the first bottom surface 310b. The first fence pattern 310 may serve as a barrier layer. According to an exemplary embodiment of the present inventive concept, charges may be trapped at an interface between the first substrate 100 and the dielectric layer 400. The first bottom surface 310b of the first fence pattern 310 may contact the dielectric layer 400, thereby removing the trapped charges. For example, the first fence pattern 310 may serve as an adhesive layer, and thus may attach the second fence pattern 320 to the dielectric layer 400.

When the fence pattern 300 has a relatively large width, the fence pattern 300 may absorb or reflect light that is externally incident thereon and therefore no light may be transferred to the first substrate 100. An increase in area of the bottom surface of the fence pattern 300 may reduce an amount of light incident on the first substrate 100. According to an exemplary embodiment of the present inventive concept, the first bottom surface 310b of the first fence pattern 310 may have a relatively small width W1. A width W1 at the first bottom surface 310b of the first fence pattern 310 may be less than a width W3 at the first top surface 310a of the first fence pattern 310. The width W1 at the first bottom surface 310b of the first fence pattern 310 may range from about 45 nm to about 55 nm. As the first fence pattern 310 has the width W1 equal to or less than about 55 nm at the first bottom surface 310b, an increased amount of light may be incident on each of the pixel regions PX of the first substrate 100. For example, an increased amount of light may be incident on each of the photoelectric conversion regions PD of the first substrate 100. As the first substrate 100 has the width W1 equal to or greater than about 45 nm at the first bottom surface 310b, the first fence pattern 310 may prevent a crosstalk between the pixel regions PX. The width W1 at the first bottom surface 310b of the first fence pattern 310 may be less than the width W11 at the top surface of the separation pattern 200.

In an exemplary embodiment of the present inventive concept, the width W3 of the first top surface 310a of the first fence portion 310 may substantially the same as the width W11 at the top surface of the separation pattern 200.

In an exemplary embodiment of the present inventive concept, the width W1 at the first bottom surface 310b of the first fence pattern 310 may be the same as the width W3 at the first top surface 310a of the first fence pattern 310.

The first fence pattern 310 may have, for example, a sandglass shape or an hourglass shape. For example, the first fence pattern 310 may include a lower portion, a middle portion, and an upper portion. The lower portion of the first fence pattern 310 may have the first bottom surface 310b. The upper portion of the first fence pattern 310 may have the first top surface 310a. The middle portion of the first fence pattern 310 may be provided between the lower and upper portions of the first fence pattern 310. The middle portion of the first fence pattern 310 may have a width less than the width W1 at the first bottom surface 310b of the first fence pattern 310 and the width W3 at the first top surface 310a of the first fence pattern 310. For example, the second fence pattern 320 may have a minimum width that is measured at a position that is higher than the first bottom surface 310b and lower than the first top surface 310a.

The second fence pattern 320 may be disposed on the first top surface 310a of the first fence pattern 310. The second fence pattern 320 may have a second bottom surface and a second top surface 320a that are opposite to each other. The second bottom surface of the second fence pattern 320 may physically contact the first top surface 310a of the first fence pattern 310. The first top surface 310a of the first fence pattern 310 may have an edge portion that is not covered with the second fence pattern 320.

The second fence pattern 320 may have a width W2 less than the width W3 at the first top surface 310a of the first fence pattern 310 and greater than the width W1 at the first bottom surface 310b of the first fence pattern 310. For example, the width W2 of the second fence pattern 320 may range from about 72 nm to about 88 nm. Unless otherwise particularly limited in this description, the width W2 of the second fence pattern 320 may indicate a width at the second bottom surface of the second fence pattern 320. As the second fence pattern 320 has the width W2 equal to or greater than about 72 nm, the second fence pattern 320 may sufficiently prevent a crosstalk between the color filters CF and a crosstalk between the pixel regions PX of the first substrate 100. As the second fence pattern 320 has the width W2 equal to or less than about 88 nm, an increased amount of light may be incident on each of the pixel regions PX of the first substrate 100. For example, the width W2 of the second fence pattern 320 may be less than the width W11 at the top surface of the separation pattern 200. However, the present inventive concept is not limited thereto. For example, the width W2 of the second fence pattern 320 may be substantially the same as or similar to the width W11 at the top surface of the separation pattern 200.

The second top surface 320a of the second fence pattern 320 may correspond to the top surface of the fence pattern 300. The second top surface 320a of the second fence pattern 320 may have a width substantially the same as that of the second bottom surface of the second fence pattern 320. For example, the second top surface 320a of the second fence pattern 320 may have a width of about 72 nm to about 88 nm.

When the second fence pattern 320 has an irregular width, the second fence pattern 320 may have a reduced structural stability or may externally reflect incident light. According to an exemplary embodiment of the preset inventive concept, the width W2 of the second fence pattern 320 may be constant along a vertical level. For example, the second top surface 320a of the second fence pattern 320 may have a width substantially the same as that at the second bottom surface of the second fence pattern 320. The second fence pattern 320 may have maximum and minimum widths each of which falls within a range of about 72 nm to about 88 nm. The maximum width of the second fence pattern 320 may be about 100% to about 102% of the minimum width of the second fence pattern 320. Accordingly, the second fence pattern 320 may increase in structural stability and an increased amount of light may be incident on the pixel regions PX of the first substrate 100.

The second fence pattern 320 may have a height H2 greater than a height H1 of the first fence pattern 310.

The second fence pattern 320 may include a material whose refractive index is low. The second fence pattern 320 may have a refractive index less than that of the first substrate 100. For example, the second fence pattern 320 may have a refractive index equal to or less than about 1.3. As shown in FIG. 3C, the second fence pattern 320 may include a polymer structure 321 and nano-particles 323 in the polymer structure 321. The nano-particles 323 may be distributed in the polymer structure 321. For example, the nano-particles 323 may be spaced apart from each other. For example, the nano-particles 323 may include silica. Light may be reflected from interfaces between the polymer structure 321 and the nano-particles 323. Therefore, the second fence pattern 320 may have a low refractive index. The second fence pattern 320 may effectively prevent a crosstalk between the color filters CF, and may also effectively prevent an optical interference between the pixel regions PX of the first substrate 100. In the drawings other than FIG. 3C, neither the polymer structure 321 nor the nano-particles 323 are illustrated in the interest of brevity.

The dielectric layer 400 may be interposed between the separation pattern 200 and the fence pattern 300 and between the first substrate 100 and the color filters CF. The dielectric layer 400 may include a first dielectric layer 410, a second dielectric layer 420, a third dielectric layer 430, a fourth dielectric layer 440, and a fifth dielectric layer 450 that are stacked on the first surface 100a of the first substrate 100. For example, the first dielectric layer 410 may contact the first surface 100a of the first substrate 100 and the top surface of the separation pattern 200, and may overlap the pixel regions PX of the first substrate 100. The second dielectric layer 420 may be disposed on the first dielectric layer 410. For example, the second dielectric layer 420 may be disposed on a top surface of the first dielectric layer 410. The first and second dielectric layers 410 and 420 may be fixed charge layers. For example, each of the fixed charge layers may be formed of a metal oxide layer or a metal fluoride layer. The metal oxide layer may include oxygen whose amount is less than a stoichiometric ratio, and the metal fluoride layer may include fluorine whose amount is less than a stoichiometric ratio. For example, the dielectric layer 410 may be formed of one of metal oxide and metal fluoride each of which includes at least one metal of hafnium (Hf), zirconium (Zr), aluminum (Al), tantalum (Ta), titanium (Ti), yttrium (Y), and/or lanthanides. The second dielectric layer 420 may include one of metal oxide and metal fluoride that are discussed in the example of the first dielectric layer 410. In addition, the second dielectric layer 420 may include a different material from that of the first dielectric layer 410. For example, the first dielectric layer 410 may include aluminum oxide, and the second dielectric layer 420 may include hafnium oxide. Each of the first and second dielectric, layers 410 and 420 may have a negative fixed charge and may produce hole accumulation. The first and second dielectric layers 410 and 420 may effectively reduce white spot and dark current of the first substrate 100. The second dielectric layer 420 may have a thickness greater than that of the first dielectric layer 410.

The third dielectric layer 430 may be disposed on the second dielectric layer 420. The third dielectric layer 430 may include a first silicon-containing material. The first silicon-containing material may include, for example, to orthosilicate (TEOS) or silicon oxide. The third dielectric layer 430 may exhibit excellent filling characteristics. The third dielectric layer 430 may be formed by, for example, plasma enhanced chemical vapor deposition, but the present inventive concept are not limited thereto. For example, the third dielectric layer 430 may have a thickness greater than that of the first dielectric layer 410 and that of the second dielectric layer 420.

The fourth dielectric layer 440 may be disposed on the third dielectric layer 430. The fourth dielectric layer 440 may include a different material from that of the third dielectric layer 430. For example, fourth dielectric layer 440 may include a second silicon-containing material, and the second silicon-containing material may be different from the first silicon-containing material of the third dielectric layer 430. For example, the fourth dielectric layer 440 may include silicon nitride. The fourth dielectric layer 440 may have a thickness greater than that of the third dielectric layer 430.

The fifth dielectric layer 450 may be interposed between the fourth dielectric layer 440 and the first fence pattern 310 and between the fourth dielectric layer 440 and the color filters CF. For example, the fifth dielectric layer 450 may physically contact the first bottom surface 310b of the first fence pattern 310. The fifth dielectric layer 450 may be an adhesive layer or a capping layer. The fifth dielectric layer 450 may include metal oxide or a high-k dielectric material. The fifth dielectric layer 450 may include the same material as that of the second dielectric layer 420. For example, the fourth dielectric layer 440 may include hafnium oxide. The fifth dielectric layer 450 may have a thickness greater than that of each of the first and second dielectric layers 410 and 420, and less than that of each of the third and fourth dielectric layers 430 and 440. A thickness of the dielectric layer 400 may mean a sum total of the thicknesses of the first, second, third, fourth, and fifth dielectric layers 410, 420, 430, 440, and 450.

The number of layers in the dielectric layer 400 may be variously changed. For example, at least one of the first, second, third, fourth, and fifth dielectric layers 410, 420, 430, 440, and 450 may be omitted.

The protective layer 470 may cover the dielectric layer 400. For example, the protective layer 470 may cover a top surface of the dielectric layer 400, and may also cover a sidewall and top surface of the fence pattern 300. For example, the protective layer 470 may conformally cover the first sidewall 310c of the first fence pattern 310, a second sidewall of the second fence pattern 320, and the second top surface 320a of the second fence pattern 320. For example, a thickness of the protective layer 470 on the first sidewall 310c of the first fence pattern 310 may be substantially the same as a thickness of the protective layer 470 on the second top surface 320a of the second fence pattern 320. The protective layer 470 may physically contact a portion of the first top surface 310a of the first fence pattern 310. For example, the protective layer 470 may cover an edge portion of the first top surface 310a of the first fence pattern 310. The protective layer 470 may have a thickness less than that of the dielectric layer 400. The protective layer 470 may include a high-k dielectric, material and may have dielectric characteristics. For example, the protective layer 470 may include aluminum oxide or hafnium oxide. For example, the protective layer 470 may include aluminum oxide, but the present inventive concept is not limited thereto. The protective layer 470 may protect the photoelectric conversion regions PD of the first substrate 100 against external environments such as moisture.

The color filters CF may be laterally spaced apart from each other on the protective layer 470. The sidewall of the fence pattern 300 may include a first sidewall and a second sidewall that are opposite to each other. The first color filter CF1 and the second color filter CF2 may be respectively disposed on the first sidewall and the second sidewall of the fence pattern 300. The color filters CF may not extend onto the second top surface 320a of the second fence pattern 320.

Referring still to FIGS. 3B and 3C, each of the color filters CF may have a top surface CFa having a convex shape protruding upward. For example, the top surface CFa of each color filter CF may have a central portion and an edge portion. The central portion of the top surface CFa of each color filter CF may be located at a higher level than that of the edge portion of the top surface CFa of each color filter CF. The shapes of the color filters CF, however, are not limited thereto. In this description, the term "level" may mean a vertical level. A difference in level between two planes may be measured in the third direction D3.

The microlens layer 500 may be disposed on the first surface 100a of the first substrate 100. For example, the microlens layer 500 may be placed on the color filters CF and the fence pattern 300. The protective layer 470 may be interposed between the microlens layer 500 and the second top surface 320a of the second fence pattern 320.

The microlens layer 500 may include a planarized portion 520 and lens portions 510. The lens portions 510 may be provided on positions that correspond to those of the photoelectric conversion regions PD of the first substrate 100. For example, the lens portions 510 may be disposed on and correspond to the color filters CF. When viewed in plan, the lens portions 510 may constitute an array along the first direction D1 and the second direction D2. Each of the lens portions 510 may protrude away from the first surface 100a of the first substrate 100. Each of the lens portions 510 may have a hemispherical cross-section. The lens portions 510 may concentrate incident light.

The planarized portion 520 of the microlens layer 500 may be interposed between the color filters CF and the lens portions 510 and between the fence pattern 300 and the lens portions 510. The planarized portion 520 may be integrally formed with the lens portions 510, and may be connected to the lens portions 510 without interfaces between the planarized portion 520 and the lens portions 510. The planarized portion 520 may include the same material as that of the lens portions 510. In addition, the planarized portion 520 may be omitted from the microlens layer 500, and the lens portions 510 of the microlens layer 500 may not be connected to each other.

The microlens layer 500 may be transparent to allow light to pass therethrough. The microlens layer 500 may include an organic material, such as a polymer. For example, the microlens layer 500 may include a photoresist material or a thermosetting resin.

The image sensor may further include a lens coating layer 530. The lens coating layer 530 may be transparent. The lens coating layer 530 may conformally cover the microlens layer 500. The lens coating layer 530 may protect the microlens layer 500.

As shown in FIG. 3B, the first substrate 100 may include impurity regions 111. In the first substrate 100, the impurity regions 111 may be disposed on corresponding pixel regions PX. The impurity regions 111 may be disposed adjacent to the second surface 100b of the first substrate 100. The impurity regions 111 may have their bottom surfaces spaced apart from the photoelectric conversion regions PD. The impurity regions 111 may be areas doped with second conductivity type impurities (e.g., n-type impurities). The impurity regions 111 may be active sections. The active sections may be areas for the operation of a transistor, and may include source/drain regions of a transistor and the floating diffusion region FD discussed with reference to FIG. 1. The transistor may include the transfer transistor Tx, the source follower transistor Sx, the reset transistor Rx, or the selection transistor Ax that are discussed with reference to FIG. 1.

A device isolation pattern 240 may be provided in the first substrate 100. The device isolation pattern 240 may provide the active sections. For example, on each of the pixel regions PX, the device isolation pattern 240 may define the impurity regions 111, and may separate the impurity regions 111 from each other. For example, in the first substrate 100, the device isolation pattern 240 may be disposed on one side of one of the impurity regions 111. The device isolation pattern 240 may be provided in a second trench, and the second trench may be recessed from the second surface 100b of the first substrate 100. For example, device isolation pattern 240 may be a shallow trench isolation (STI) layer. For example, the device isolation pattern 240 may have a height less than that of the separation pattern 200. A portion of the device isolation pattern 240 may be connected to a sidewall of the first separation pattern 210. The device isolation pattern 240 may include, for example, one or more of silicon oxide, silicon nitride, and silicon oxynitride.

A gate pattern 700 may be disposed on the second surface 100b of the first substrate 100. The gate pattern 700 may serve as a gate electrode of one of the transfer transistor Tx, the source follower transistor Sx, the reset transistor Rx, and the selection transistor Ax that are discussed above with reference to FIG. 1. For example, the gate pattern 700 may include one of the transfer gate TG, the source follower gate SG, the reset gate RG, and the selection gate AG. For brevity, FIG. 3B depicts that a single gate pattern 700 is disposed on each pixel region PX, but a plurality of gate patterns 700 may be disposed on each pixel region PX. A single gate pattern 700 will be discussed below for brevity of description.

The gate pattern 700 may have a buried gate structure. For example, the gate pattern 700 may include a first portion 710 and a second portion 720. The first portion 710 of the gate pattern 700 may be disposed on the second surface 100b of the first substrate 100. The second portion 720 of the gate pattern 700 may protrude into the first substrate 100. The second portion 720 of the gate pattern 700 may be connected to the first portion 710 of the gate pattern 700. However, the present inventive concept is not limited thereto. For example, the gate pattern 700 may have a planar gate structure. In this case, the gate pattern 700 may not include the second portion 720. The gate pattern 700 may include, for example, metal, metal silicide, polysilicon, or any combination thereof. In this case, the polysilicon may include doped polysilicon.

A gate dielectric pattern 740 may be interposed between the gate pattern 700 and the first substrate 100. The gate dielectric pattern 740 may include, for example, one or more of a silicon-based dielectric material (e.g., silicon oxide, silicon nitride, and/or silicon oxynitride) and a high-k dielectric material (e.g., hafnium oxide and/or aluminum oxide).

The first wiring layer 800 may be disposed on the second surface 100b of the first substrate 100. The first wiring layer 800 may include a first lower dielectric layer 810, second lower dielectric layers 820, and first conductive structures 830. The first lower dielectric layer 810 may cover the gate pattern 700 and the second surface 100b of the first substrate 100. The second lower dielectric layers 820 may be stacked on the first lower dielectric layer 810. The first and second lower dielectric layers 810 and 820 may include a silicon-based dielectric material, such as one or more of silicon oxide, silicon nitride, and silicon oxynitride.

The first conductive structures 830 may be provided in the first and second lower dielectric layers 810 and 820. For example, the first conductive structures 830 may each include a contact plug portion, a line portion, and a via portion. For example, the contact plug portion may be provided in the first lower dielectric layer 810 and may be electrically connected to the gate pattern 700 or one of the impurity regions 111. For example, the line portion of the first conductive structure 830 may be interposed between two neighboring lower dielectric layers 810 and 820. For example, the line portion may be connected to the contact plug portion. For example, the via portion of the first conductive structure 830 may penetrate at least one of the second lower dielectric layers 820 and may be connected to the line portion. The first conductive structures 830 may receive photoelectric signals that are output from the photoelectric conversion regions PD.

The following will discuss a fence pattern according to an exemplary embodiment of the present inventive concept.

FIGS. 4A to 4E illustrate cross-sectional views of section C in FIG. 3B, showing a pixel array region of an image sensor according to an exemplary embodiment of the present inventive concept. The following will also refer to FIGS. 3A and 3B.

Referring to FIGS. 4A to 4E, an image sensor may include a first substrate 100, a separation pattern 200, a dielectric layer 400, a fence pattern 300, a protective layer 470, color filters CF, and a microlens layer 500. The fence pattern 300 may include a first fence pattern 310 and a second fence pattern 320. The first fence pattern 310 and the second fence pattern 320 may be substantially the same as those discussed in FIGS. 3A to 3C. For example, the width W1 at the first bottom surface 310b of the first fence pattern 310 and the width W2 of the second fence pattern 320 may satisfy the conditions discussed in FIGS. 3A to 3C. In addition, the shape of the fence pattern 300 may be variously changed.

Figure 4A:
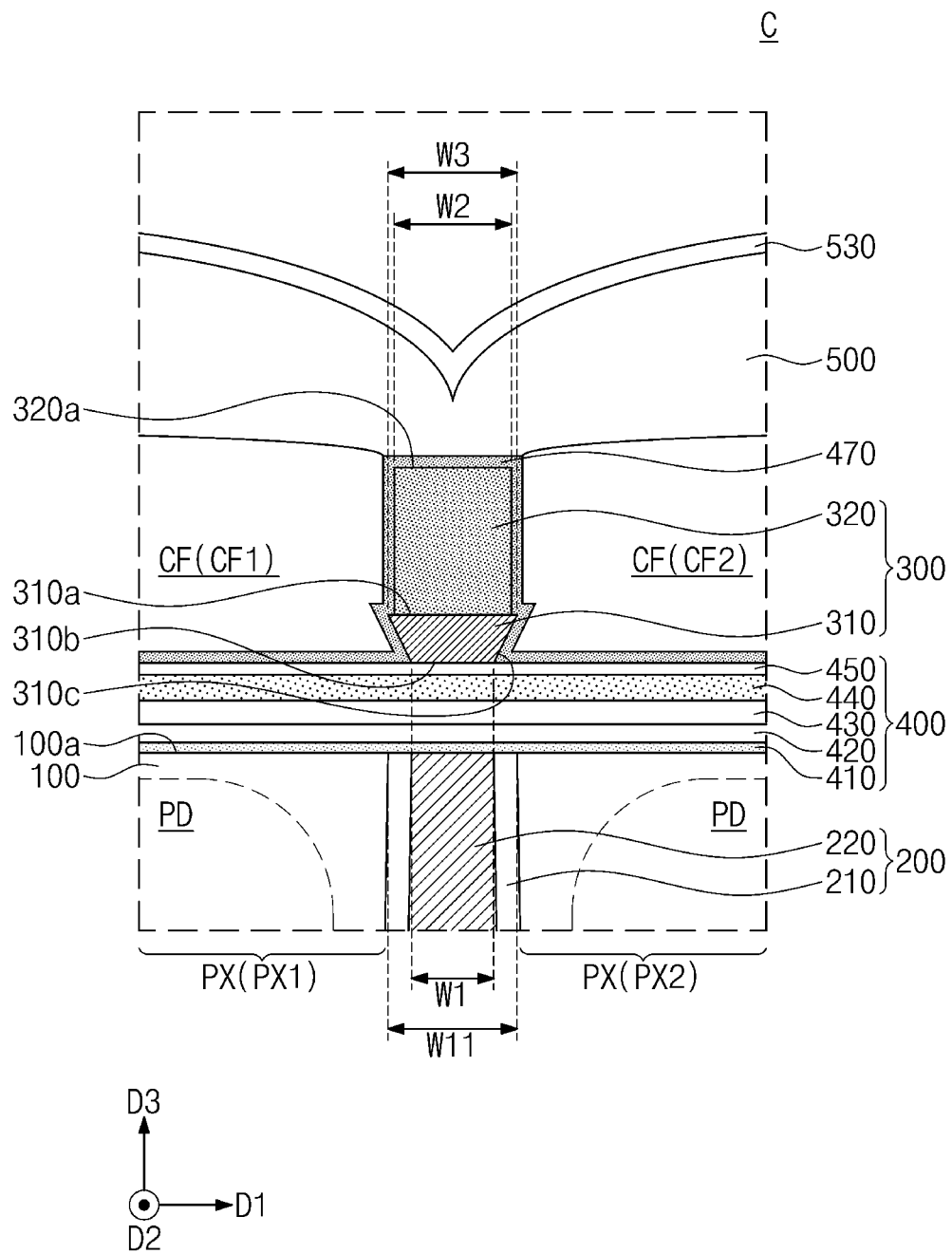
FIGS. 4A, 4B, 4C, 4D and 4E illustrate cross-sectional views of section C in FIG. 3B, showing a pixel array region of an image sensor according to an exemplary embodiment of the present inventive concept.

As shown in FIG. 4A, the first fence pattern 310 may have a polygonal shape. For example, the first fence pattern 310 may have an inverse trapezoidal shape. The width W1 at the first bottom surface 310b of the first fence pattern 310 may be a minimum width of the first fence pattern 310, and the width W3 at the first top surface 310a of the first fence pattern 310 may be a maximum width of the first fence pattern 310. The first fence pattern 310 may have a width that gradually decreases as approaching the first bottom surface 310b from the first top surface 310a.

Figure 4B:
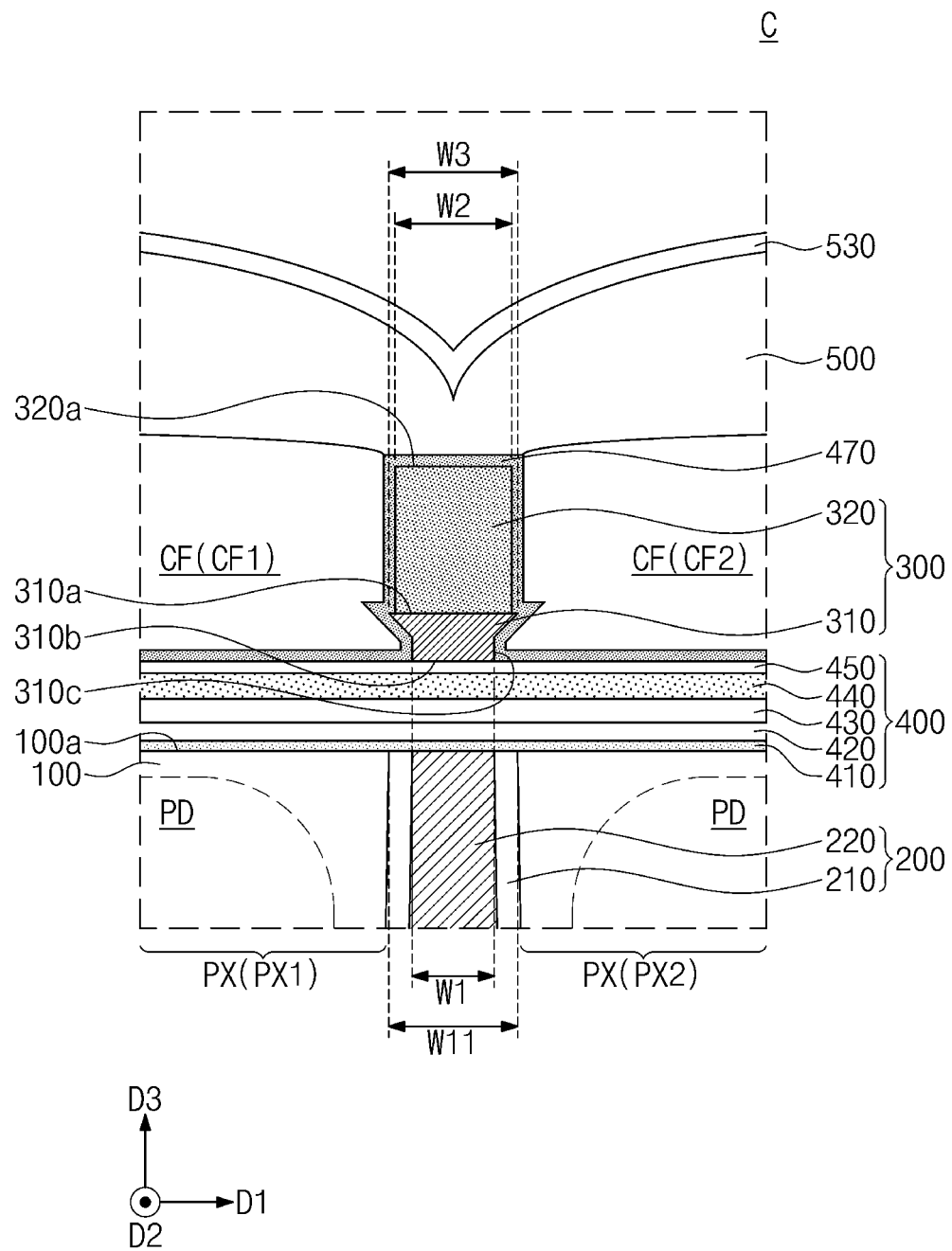

As shown in FIG. 4B, the first fence pattern 310 may include lower and upper portions. For example, the lower portion of the first fence pattern 310 may have a rectangular cross-section. The first bottom surface 310b of the first fence pattern 310 may be a bottom surface of the lower portion of the first fence pattern 310. For example, the lower portion of the first fence pattern 310 may have a width that is substantially uniform. For example, the upper portion of the first fence pattern 310 may have an inverse trapezoidal shape. The upper portion of the first fence pattern 310 may have a width that gradually increases as approaching the first top surface 310a of the first fence pattern 310. The first top surface 310a of the first fence pattern 310 may correspond to a top surface of the upper portion of the first fence pattern 310. The upper and lower portions of the first fence pattern 310 may include the same material as each other and may be connected to each other without an interface therebetween.

Figure 4C:
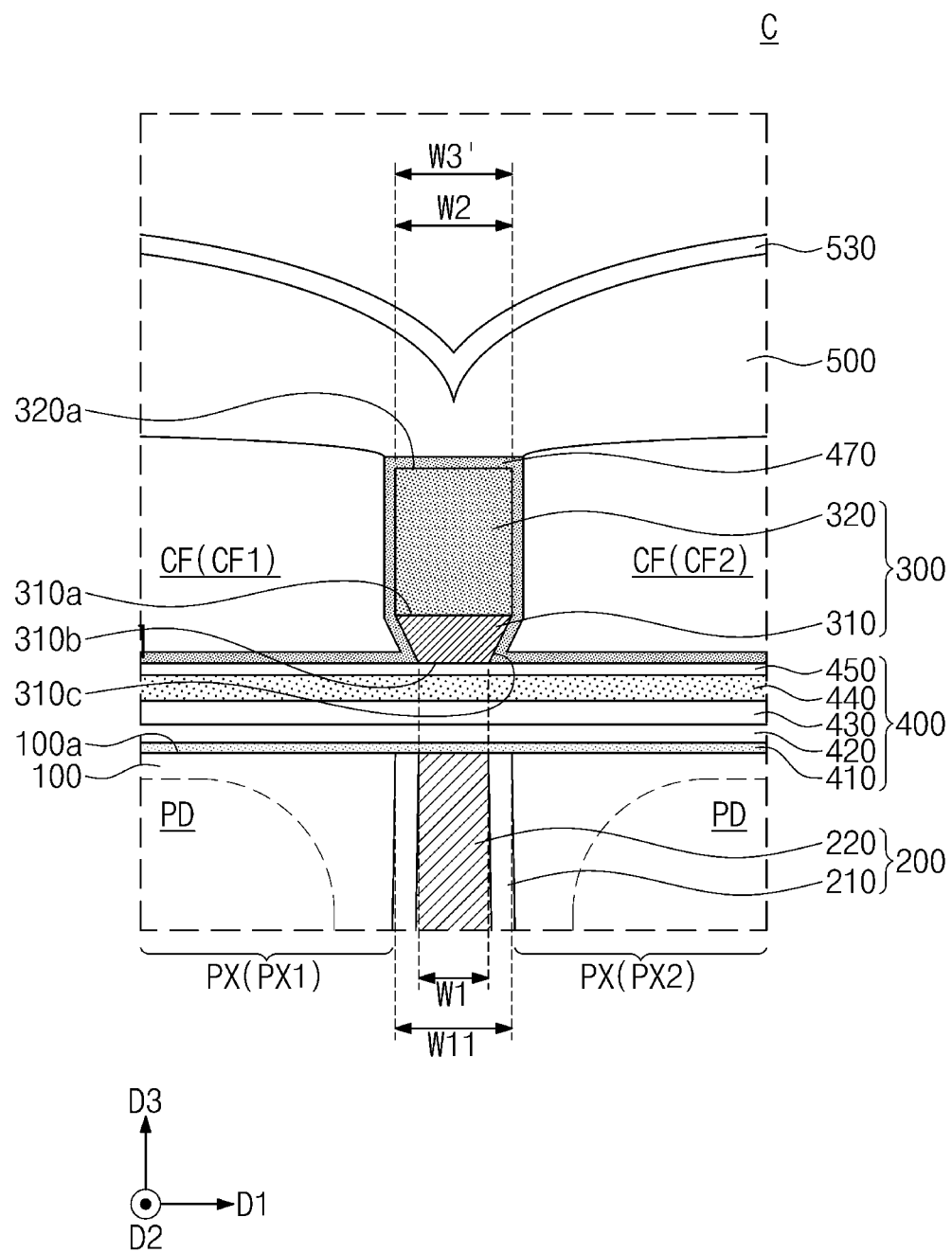

As shown in FIG. 4C, the first top surface 310a of the first fence pattern 310 may have a width W3' substantially the same as the width W2 of the second fence pattern 320. For example, the width W3' at the first top surface 310a of the first fence pattern 310 may range from about 72 nm to about 88 nm. In an embodiment of the present inventive concept, the width W3' at the first top surface 310a of the first fence pattern 310 may be less that the width W2 of the second fence pattern 320. The first top surface 310a of the first fence pattern 310 may be covered with the second fence pattern 320.

Figure 4D:
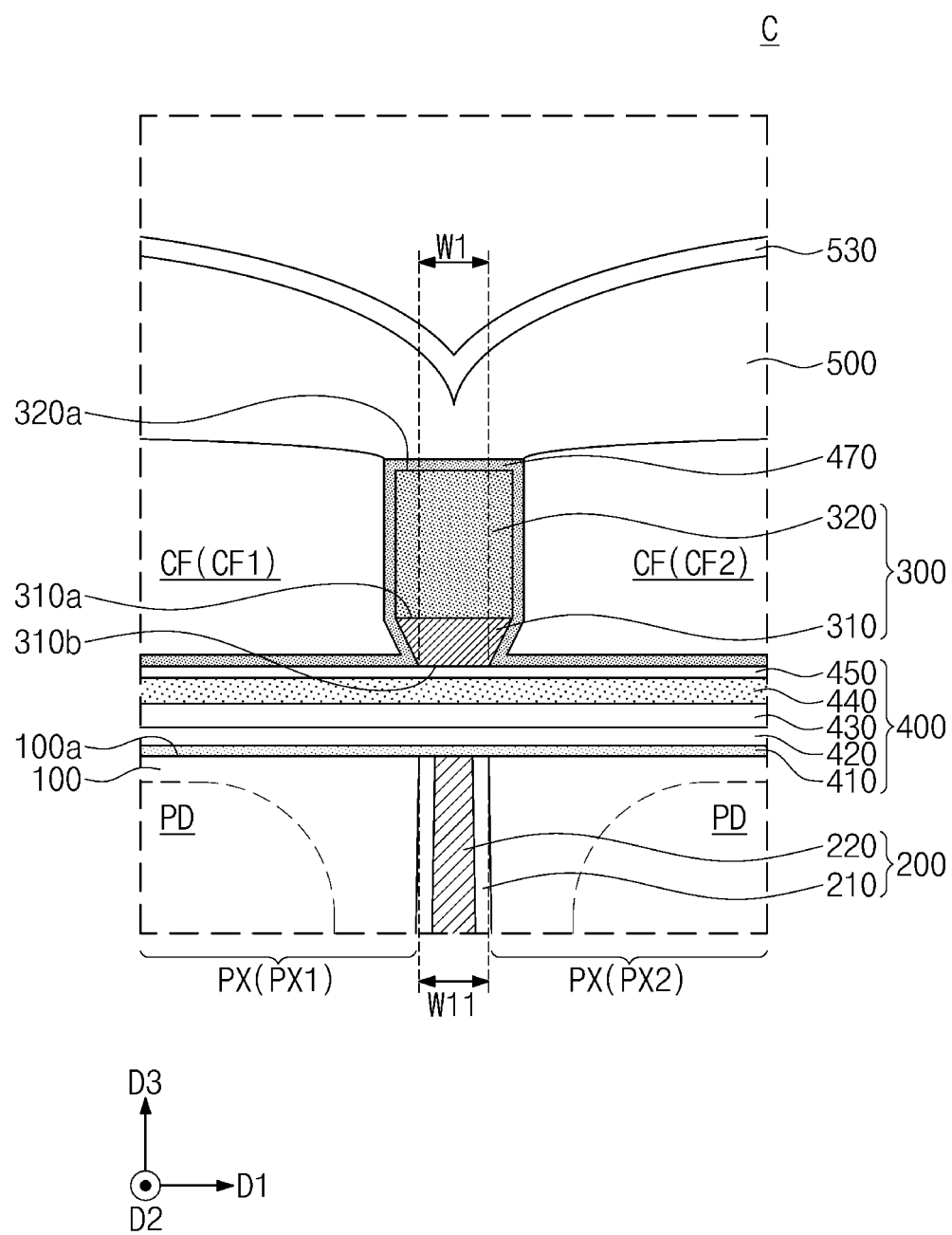

Referring to FIG. 4D, the width W1 at the first bottom surface 310b of the first fence pattern 310 may be substantially the same as the width W11 at the top surface of the separation pattern 200.

Figure 4E:
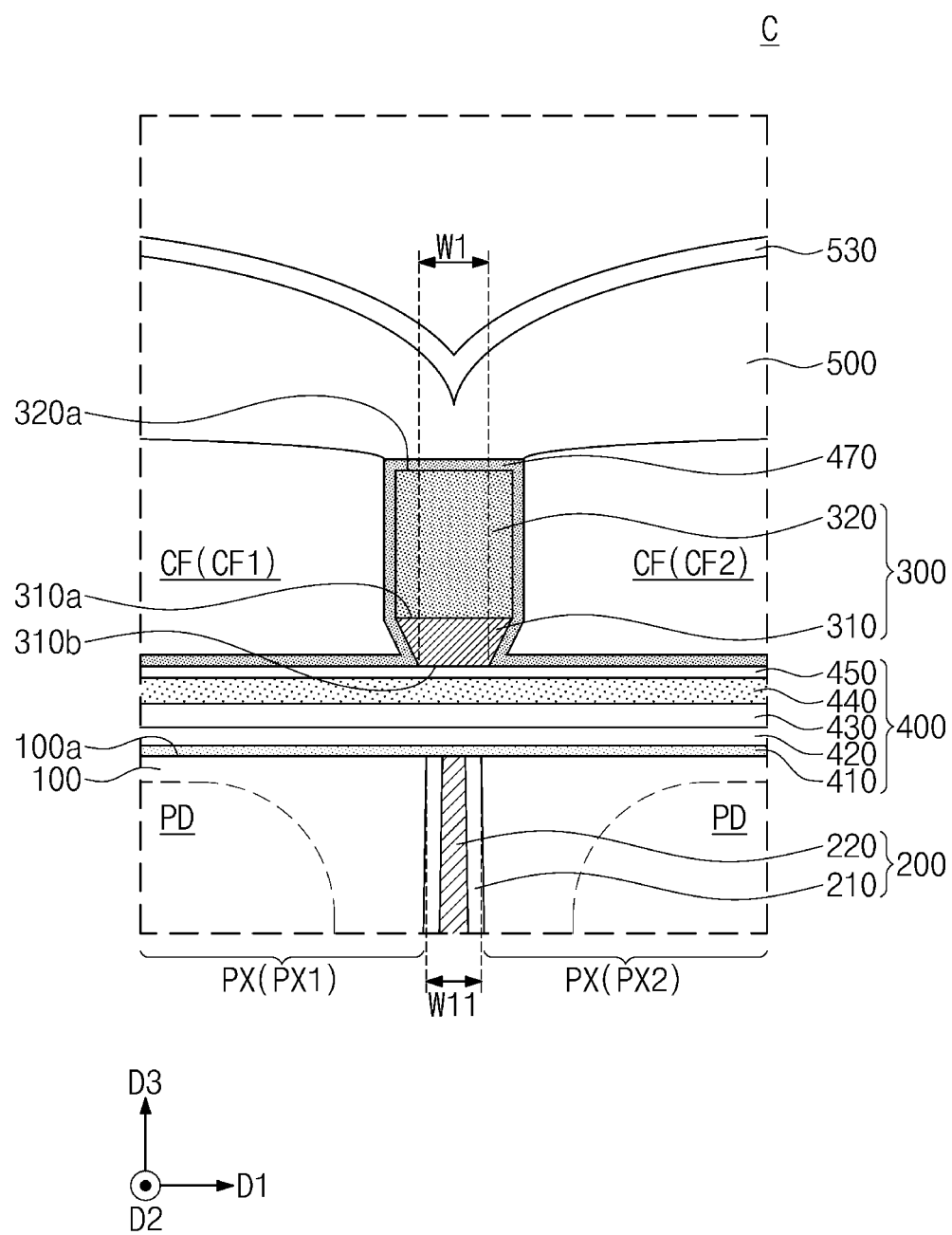

As shown in FIG. 4E, the width W1 at the first bottom surface 310b of the first fence pattern 310 may be greater than the width W11 at the top surface of the separation pattern 200. Therefore, a portion of the first bottom surface 310b of the first fence pattern 310 may vertically overlap the first surface 100a of the first substrate 100.

In the embodiments of FIGS. 4A to 4E, the first substrate 100, the separation pattern 200, the dielectric layer 400, the fence pattern 300, the protective layer 470, the color filters CF, and the microlens layer 500 may be substantially the same as those discussed in the example of FIGS. 3A to 3C. The first substrate 100 may further include the device isolation pattern 240 and the impurity regions 111 discussed in the example of FIGS. 3A to 3C, and the image sensor may further include the first wiring layer 800, the gate pattern 700, and the gate dielectric pattern 740 discussed in the example of FIGS. 3A to 3C.

Figure 5:
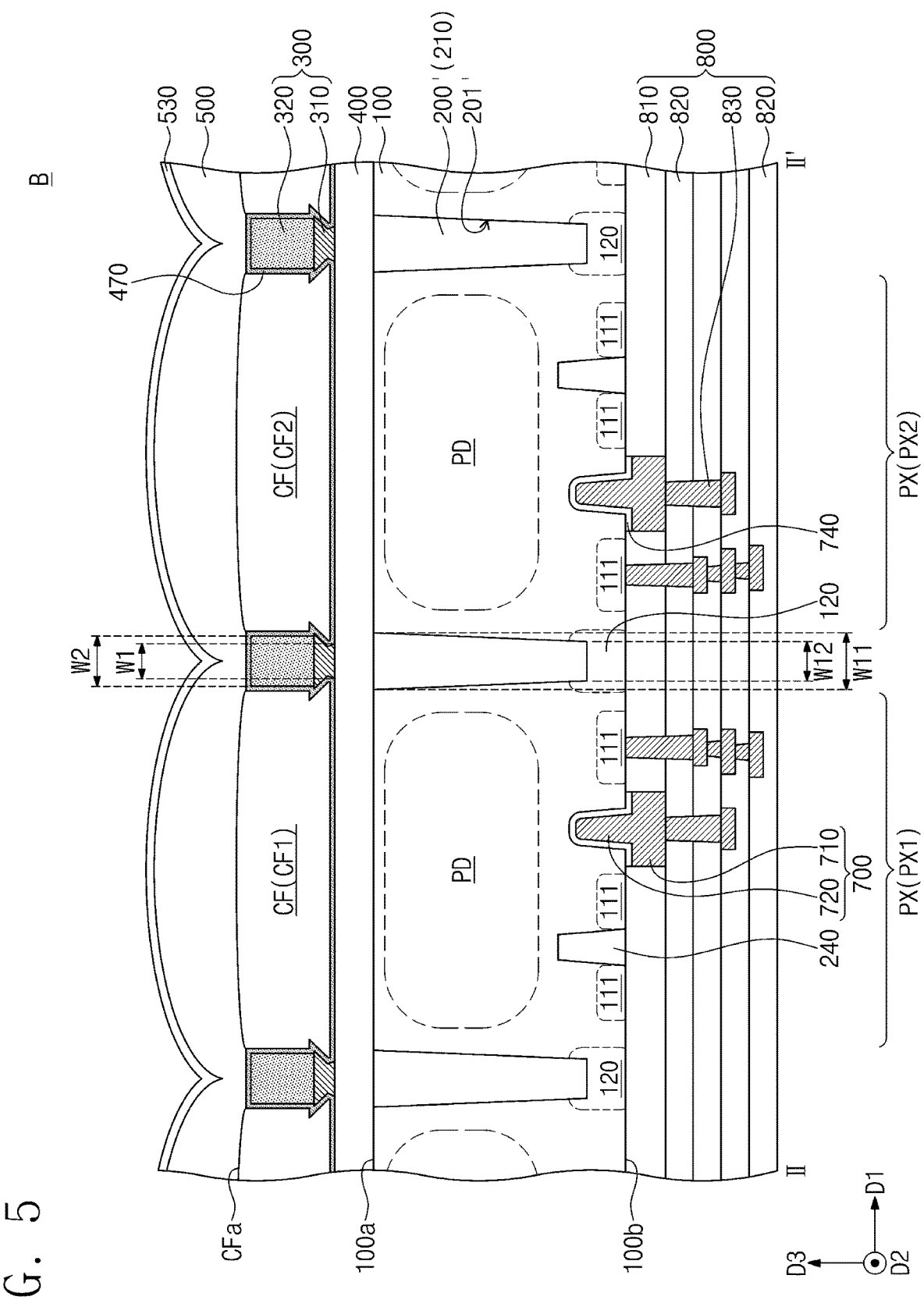
FIG. 5 illustrates a cross-sectional view taken along line II-II' of FIG. 3A, showing a pixel array region of an image sensor according to an exemplary embodiment of the present inventive concept.

FIG. 5 illustrates an enlarged cross-sectional view of section B in FIG. 2B taken along line II-II' of FIG. 3A, showing a pixel array region of an image sensor according to an embodiment of the present inventive concept.

Referring to FIG. 5, an image sensor may include a first substrate 100, a separation pattern 200', a dielectric layer 400, a fence pattern 300, a protective layer 470, color filters CF, and a microlens layer 500.

The separation pattern 200' may be provided in the first substrate 100. The separation pattern 200' may be provided in a first trench 201', and the first trench 201' may penetrate the first surface 100a of the first substrate 100. The first trench 201' may have a bottom surface provided in the first substrate 100. The separation pattern 200' may have a bottom surface spaced apart from the second surface 100b of the first substrate 100. For example, the separation pattern 200' may have a top surface at substantially the same level as that of the first surface 100a of the first substrate 100; however, the present inventive concept is not limited thereto. The top surface of the separation pattern 200' may have a width W11 greater than a width W12 at the bottom surface of the separation pattern 200'. For example, the width of the separation pattern 200' may gradually decrease towards the second surface 100b of the first substrate 100. The separation pattern 200' may include the first separation pattern 210, but may not include the second separation pattern 220 discussed in FIGS. 3A and 3B.

A separation region 120 may be provided in the first substrate 100. The separation region 120 may be provided between the bottom surface of the separation pattern 200' and the second surface 100b of the first substrate 100. The separation region 120 may include a III-group element. For example, the separation region 120 may be an area doped with impurities having a first conductivity type (e.g., p-type). The separation region 120 and the separation pattern 200' may provide the pixel regions PX. In an exemplary embodiment of the present inventive concept, the separation pattern 200' may further penetrate the second surface 100b of the first substrate 100.

According to an exemplary embodiment of the present inventive concept, the examples of FIGS. 3A to 3C, FIG. 4A, FIG. 4B, FIG. 4C, FIG. 4D, FIG. 4E, and FIG. 5 may be combined with each other. For example, as discussed in the example of FIG. 3C, the first fence pattern 310 may have a sandglass shape, and as discussed in the example of FIG. 4E, the width W1 at the first bottom surface 310b of the first fence pattern 310 may be greater than the width W11 at the top surface of the separation pattern 200.

The following will describe a circuit chip 20 of the image sensor, and an optical black region OB and a pad region PAD of the first substrate 100.

Referring back to FIGS. 2A and 2B, the optical black region OB of the first substrate 100 may be interposed between the pixel array region APS and the pad region PAD. The optical black region OB may include a first reference pixel region RPX1 and a second reference pixel region RPX2. The first reference pixel region RPX1 may be disposed between the second reference pixel region RPX2 and the pixel array region APS. On the optical black region OB, the photoelectric conversion region PD may be provided in the first reference pixel region RPX1. The photoelectric conversion region PD on the first reference pixel region RPX1 may have a planar area and a volume the same as those of each of the photoelectric conversion regions PD on the pixel regions PX. The photoelectric conversion region PD may not be provided on the second reference pixel region RPX2; however, the present inventive concept is not limited thereto. The impurity regions 111, the gate pattern 700, and the device isolation pattern 240 may be disposed on each of the first and second reference pixel regions RPX1 and RPX2. The impurity regions the gate pattern 700, and the device isolation pattern 240 may be the same as those discussed in FIG. 3B.

The dielectric layer 400 may extend onto the optical black region OB and the pad region PAD of the first substrate 100, and may cover the first surface 100a of the first substrate 100.

A light-shield layer 950 may be provided on the first surface 100a on the optical black region OB of the first substrate 100. The light-shield layer 950 may be disposed on the top surface of the dielectric layer 400. The light-shield layer 950 may not allow light to enter the photoelectric conversion region PD on the optical black region OB. Pixels of the first and second reference pixel regions RPX1 and RPX2 on the optical black region OB may output noise signals without outputting photoelectric signals. The noise signal may be generated from electrons produced by heat or dark current. The light-shield layer 950 may not cover the pixel array region APS, and thus light may be incident on the photoelectric conversion regions PD on the pixel array region APS. The noise signals may be removed from photoelectric signals that are output from the pixel regions PX. The light-shield layer 950 may include metal, such as tungsten, copper, aluminum, or any alloy thereof.

On the optical black region OB of the first substrate 100, a first conductive pattern 911 may be disposed between the dielectric layer 400 and the light-shield layer 950. For example, the first conductive pattern 911 may serve as a barrier layer or an adhesive layer. The first conductive pattern 911 may include one or more of metal and/or metal nitride. For example, the first conductive pattern 911 may include one or more of titanium and/or titanium nitride. The first conductive pattern 911 may not extend onto the pixel array region APS of the first substrate 100.

On the optical black region OB of the first substrate 100, a contact plug 960 may be provided on the first surface 100a of the first substrate 100. The contact plug 960 may be disposed in the dielectric layer 400 and on a top surface at an outermost portion of the separation pattern 200. For example, the outermost portion of the separation pattern 200 may be nearest to the pad region PAD. A contact trench may be formed on the first surface 100a of the first substrate 100, and the contact plug 960 may be provided in the contact trench. For example, the contact plug 960 may include a different material from that of the light-shield layer 950. For example, the contact plug 960 may include a metallic material, such as aluminum. The first conductive pattern 911 may extend into a space between the contact plug 960 and the dielectric layer 400 and a space between the contact plug 960 and the separation pattern 200. The contact plug 960 may be electrically connected through the first conductive pattern 911 to the second separation pattern 220. Therefore, a negative bias voltage may be applied to the second separation pattern 220.

On the optical black region OB of the first substrate 100, a protective dielectric layer 471 may be disposed on the light-shield layer 950 and the contact plug 960. For example, the protective dielectric layer 471 may be disposed on a top surface of the light-shield layer 950 and a top surface of the contact plug 960. The protective dielectric layer 471 may include the same material as that of the protective layer 470 and may be connected to the protective layer 470. For example, the protective dielectric layer 471 may be integrally formed with the protective layer 470. In addition, the protective dielectric layer 471 may be formed by a process that is separate from that used for forming the protective layer 470, and may be spaced apart from the protective layer 470. The protective dielectric layer 471 may include a high-k dielectric material (e.g., aluminum oxide and/or hafnium oxide).

A filtering layer 550 may be disposed on the first surface 100a on the optical black region OB. The filtering layer 550 may cover the protective dielectric layer 471. For example, the filtering layer 550 may cover a top surface of the protective dielectric layer 471. The filtering layer 550 may block light whose wavelength is different from that of light produced from the color filters CF. For example, the filtering layer 550 may block an infrared ray. The filtering layer 570 may include a blue color filter, but the present inventive concept is not limited thereto.

The optical black region OB may include an organic layer 501 disposed on the filtering layer 550. For example, the organic layer 501 may be disposed on a top surface of the filtering layer 550. The organic layer 501 may be transparent. The organic layer 501 may have a top surface that is opposite to the first substrate 100 and is substantially flat. The organic layer 501 may include, for example, a polymer. The organic layer 501 may have dielectric characteristics. In an exemplary embodiment of the present inventive concept, the organic layer 501 may be connected to the microlens layer 500. For example, the organic layer 501 may include the same material as that of the microlens layer 500.

A coating layer 531 may be provided on the organic layer 501. For example, the coating layer 531 may conformally cover the top surface of the organic layer 501. The coating layer 531 may include a dielectric material and may be transparent. For example, the coating layer 531 may include the same material as that of the lens coating layer 530.

The first wiring layer 800 may cover the second surface 100b of the first substrate 100, and may be provided on the pixel array region APS, the optical black region OB, and the pad region PAD of the first substrate 100.

The image sensor may further include the circuit chip 20. The circuit chip 20 may be stacked on the sensor chip 10. The circuit chip 20 may include a second wiring layer 1800 and a second substrate 1000. The second wiring layer 1800 may be interposed between the first wing layer 800 and the second substrate 1000. Integrated circuits 1700 may be disposed on a top surface of the second substrate 1000 or may be disposed inside the second substrate 1000. The integrated circuits 1700 may include logic circuits, memory circuits, or any combination thereof. The integrated circuits 1700 may include, for example, transistors. The second wiring layer 1800 may include third lower dielectric layers 1820 and second conductive structures 1830. The second conductive structures 1830 may be provided between the third lower dielectric layers 1820 or may be provided in the third lower dielectric layers 1820. The second conductive structures 1830 may be electrically connected to the integrated circuits 1700. The second wiring layer 1800 may further include via patterns, and in the third lower dielectric layers 1820, the via patterns may penetrate the third lower dielectric layers 1820 to be coupled to the second conductive structures 1830. A single second conductive structure 1830 will be discussed below for brevity of description.

The following will explain components on the pad region PAD of the first substrate 100.

The pad terminal 900 may be disposed on the pad region PAD of the first substrate 100. The pad terminal 900 may be disposed on the first surface 100a of the first substrate 100. For example, the pad terminal 900 may be buried in the first substrate 100. For example, a pad trench 990 may be formed on the first surface 100a on the pad region PAD of the first substrate 100, and the pad terminal 900 may be provided in the pad trench 990. The pad terminal 900 may include metal, such as aluminum, copper, tungsten, titanium, tantalum, or any alloy thereof, in mounting the image sensor, a bonding wire may be formed on and coupled to the pad terminal 900. The pad terminal 900 may be electrically connected through the bonding wire to the outside.

A first through hole 901 may be disposed on a first side of the pad terminal 900. The first through hole 901 may be provided between the pad terminal 900 and the contact plug 960. The first through hole 901 may penetrate the dielectric layer 400, the first substrate 100, and the first wiring layer 800. The first through hole 901 may further penetrate at least a portion of the second wiring layer 1800. For example, the first through hole 901 may have a first bottom surface and a second bottom surface. The first bottom surface of the first through hole 901 may expose the first conductive structure 830. The second bottom surface of the first through hole 901 may be located at a lower level than that of the first bottom surface of the first through hole 901. The second bottom surface of the first through hole 901 may expose the second conductive structure 1830. For example, a portion of the first through hole 901 may penetrate the dielectric layer 400, the first substrate 100, and the second lower dielectric layer 820 of the first wiring layer 800 to expose the first conductive structure 830, and another portion of the first through hole 901 may penetrate the dielectric layer 400, the first substrate 100, the first wiring layer 800, and the third lower dielectric layer 1820 to expose the second conductive structure 1830.

The first conductive pattern 911 may extend onto the pad region PAD of the first substrate 100. On the pad region PAD of the first substrate 100, the first conductive pattern 911 may be disposed on the first surface 100a of the first substrate 100 and may cover an inner sidewall of the first through hole 901. As shown in FIG. 2A, the pad terminal 900 may be provided in plural. For example, the plurality of pad terminals 900 may include a first pad terminal and a second pad terminal. The first conductive pattern 911 may be provided on a bottom surface and a sidewall of one (e.g., a first pad terminal) of the plurality of pad terminals 900, and may be electrically connected to the one pad terminal 900 (e.g., the first pad terminal).

The first conductive pattern 911 may cover the sidewall and the first bottom surface of the first through hole 901. The first conductive pattern 911 may contact a top surface of the first conductive structure 830. Therefore, the first conductive structure 830 may be electrically connected through the first conductive pattern 911 to the one pad terminal 900 (e.g., the first pad terminal). When the image sensor operates, a voltage may be applied to the first conductive structure 830 through the one pad terminal 900 and the first conductive pattern 911. The voltage may also be applied to the second separation pattern 220 through the first conductive pattern 911 and the contact plug 960. The voltage may be a negative bias voltage.

The first conductive pattern 911 may cover the second bottom surface of the first through hole 901, and may be coupled to a top surface of the second conductive structure 1830. The integrated circuits 1700 in the circuit chip 20 may be electrically connected to the one pad terminal 900 (e.g., the first pad terminal) through the second conductive structure 1830 and the first conductive pattern 911. The first conductive pattern 911 and the first through hole 901 may each be provided in plural. In this case, one of the first conductive patterns 911 may be coupled to the first conductive structure 830 or the second conductive structure 1830 without being coupled to the contact plug 960. The first conductive pattern 911 may serve as an electrical path between a transistor of the sensor chip 10 and the integrated circuit 1700 of the circuit chip 20. The first conductive pattern 911 may include metal, such as copper, tungsten, aluminum, titanium, tantalum, or any alloy thereof.

A first buried pattern 921 may be provided in the first through hole 901, thereby filling the first through hole 901. The first buried pattern 921 may not extend onto the first surface 1100a of the first substrate 100. The first buried pattern 921 may include a material whose refractive index is low and may have dielectric characteristics. The first buried pattern 921 may include the same material as that of the first fence pattern 310. The first buried pattern 921 may include the polymer structure 321 and the nano-particles 323 as discussed in the example of the first fence pattern 310 shown in FIG. 3C. A top surface of the first buried pattern 921 may be recessed. For example, the top surface of the first buried pattern 921 may have a central portion located at a lower level than that of an edge portion of the top surface of the first buried pattern 921. For example, the top surface of the first buried pattern 921 may be concave.

A first capping pattern 931 may be disposed on the top surface of the first buried pattern 921. For example, the first capping pattern 931 may have a shape conforming to the top surface of the first buried pattern 921 to fill the recessed portion of the first buried pattern 921. For example, the first capping pattern 931 may have a convex shape. The first capping pattern 931 may have a top surface that is substantially flat. The first capping pattern 931 may include a dielectric polymer, such as a photoresist material.

A second through hole 902 may be disposed on a second side of the pad terminal 900. The second side of the pad terminal 900 may be different from the first side of the pad terminal 900. The second through hole 902 may penetrate the dielectric layer 400, the first substrate 100 and the first wiring layer 800. The second through hole 902 may penetrate a portion of the second wiring layer 1800 and may expose the second conductive structure 1830.

On the pad region PAD of the first substrate 100, a second conductive pattern 912 may be provided on the first surface 100a of the first substrate 1100. As shown in FIG. 2B, the second conductive pattern 912 may be interposed between the first substrate 100 and another (e.g., a second pad terminal) of the pad terminals 900, and may be electrically connected to the another pad terminal (e.g., the second pad terminal). The second conductive pattern 912 may extend into the second through hole 902, and may conformally cover a sidewall and a bottom surface of the second through hole 902. The second conductive pattern 912 may be electrically connected to the second conductive structure 1830. When the image sensor operates, the integrated circuits 1700 of the circuit chip 20 may transmit and receive an electrical signal through the second conductive structure 1830, the second conductive pattern 912, and the another pad terminal (e.g., the second pad terminal).

A second buried pattern 922 may be provided in the second through hole 902, thereby filling the second through hole 902. The second buried pattern 922 may not extend onto the first surface 100a of the first substrate 100. The second buried pattern 922 may include a material whose refractive index is low and may have dielectric characteristics. For example, the second buried pattern 922 may include the same material as that of the first fence pattern 310. A top surface of the second buried pattern 922 may be recessed.

A second capping pattern 932 may be disposed on the top surface of the second buried pattern 922. For example, the second capping pattern 932 may have a shape conforming to the top surface of the second buried pattern 922 to fill the recessed portion of the second buried pattern 922. The second capping pattern 932 may have a top surface that is substantially flat. The second capping pattern 932 may include a dielectric polymer, such as a photoresist material.

The protective dielectric layer 471 may extend onto the pad region PAD of the first substrate 100. The protective dielectric layer 471 may be provided on the top surface of the dielectric layer 400, and may extend into the first through hole 901 and the second through hole 902. In the first through hole 901, the protective dielectric layer 471 may be interposed between the first conductive pattern 911 and the first buried pattern 921. In the second through hole 902, the protective dielectric layer 471 may be interposed between the second conductive pattern 912 and the second buried pattern 922. The protective dielectric layer 471 may expose the pad terminal 900.

The organic layer 501 and the coating layer 531 may further be provided on the pad region PAD of the first substrate 100. On the first surface 100a of the first substrate 100, the organic layer 501 may cover a portion of the protective dielectric layer 471 and the first capping pattern 931. The organic layer 501 may expose a top surface of the pad terminal 900.

Figure 6:
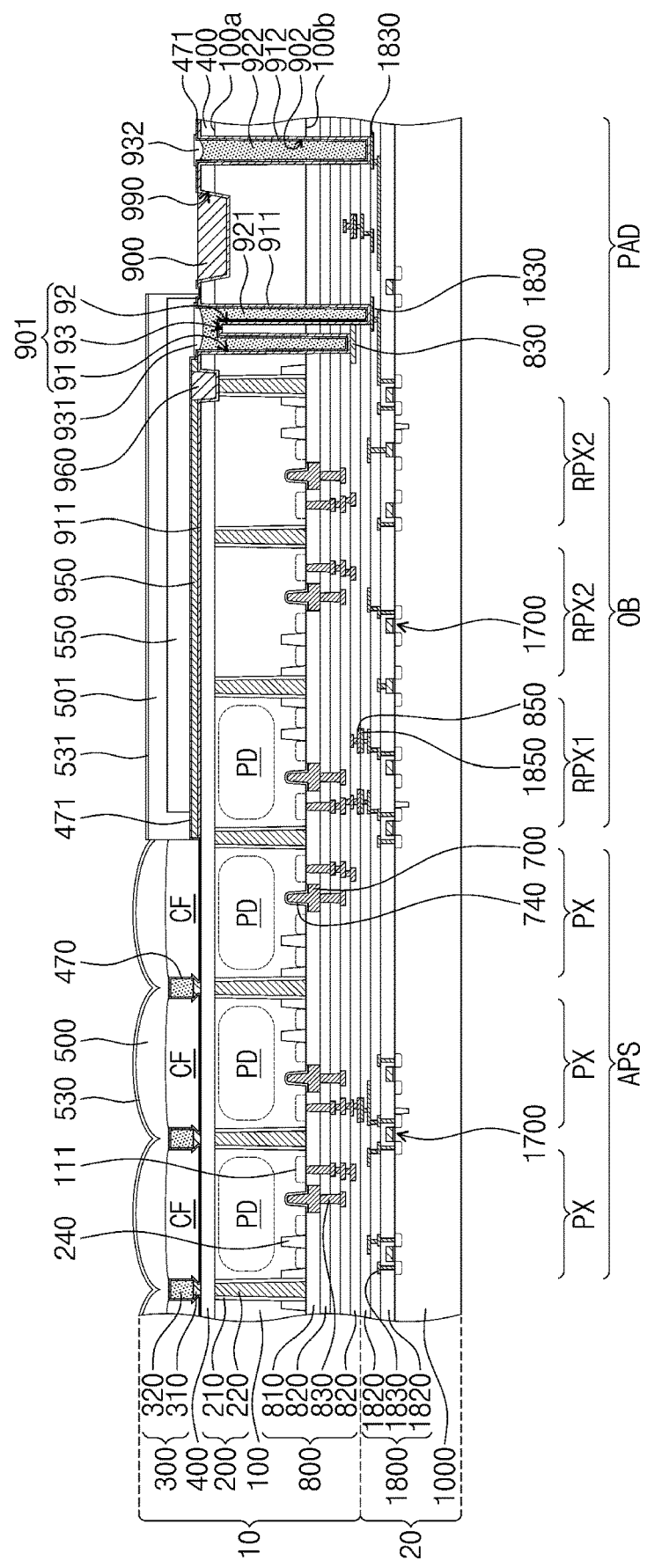
FIG. 6 illustrates a cross-sectional view taken along line I-I' of FIG. 2A, showing an image sensor according to an exemplary embodiment of the present inventive concept.

FIG. 6 illustrates a cross-sectional view taken along line I-I' of FIG. 2A, showing an image sensor according to an exemplary embodiment of the present inventive concept. The following will also refer to FIG. 2A, and a repetitive description will be omitted below.

Referring to FIG. 6, an image sensor may include a sensor chip 10 and a circuit chip 20. The sensor chip 10 and the circuit chip 20 may be substantially the same as those discussed above with reference to FIGS. 2A and 2B. For example, the sensor chip 10 may include the first substrate 100, the first wiring layer 800, the separation pattern 200, the dielectric layer 400, the fence pattern 300, the color filters CF, the protective layer 470, the microlens layer 500, the pad terminal 900, the first conductive pattern 911, and the second conductive pattern 912. The circuit chip 20 may include the second substrate 1000 and the second wiring layer 1800.

In addition, the sensor chip 10 may further include a first connection pad 850. The first connection pad 850 may be exposed on a bottom surface of the sensor chip 10. For example, the first connection pad 850 may be disposed in the second lower dielectric layer 820 of the first wiring layer 800. The first connection pad 850 may be electrically connected to the first conductive structure 830. The first connection pad 850 may include a conductive material, such as metal. For example, the first connection pad 850 may include copper. For another example, the first connection pad 850 may include aluminum, tungsten, titanium, or any alloy thereof.

The circuit chip 20 may include a second connection pad 1850. The second connection pad 1850 may be exposed on a top surface of the circuit chip 20. The second connection pad 1850 may be disposed in the third lower dielectric layer 1820. The second connection pad 1850 may be electrically connected to the integrated circuit 1700. The second connection pad 1850 may include a conductive material, such as metal. For example, the second connection pad 1850 may include copper. For another example, the second connection pad 1850 may include aluminum, tungsten, titanium, or any alloy thereof.

For example, the circuit chip 20 and the sensor chip 10 may be connected to each other by direct bonding. For example, the first connection pad 850 and the second connection pad 1850 may be vertically aligned and in contact with each other. Therefore, the second connection pad 1850 may be directly bonded to the first connection pad 850. An electrical signal may be transferred from the integrated circuit 1700 of the circuit chip 20 to the pad terminal 900 or transistor of the sensor chip 10 through the second conductive structure 1830, the second connection pad 1850, the first connection pad 850, and the first conductive structure 830. For example, the second lower dielectric layer 820 may be directly bonded to the third lower dielectric layer 1820. In this case, a chemical bond may be formed between the second lower dielectric layer 820 and the third lower dielectric layer 1820.

The first through hole 901 may include a first through hole portion 91, a second through hole portion 92, and a third through hole portion 93. The first through hole portion 91 may penetrate the dielectric layer 400, the first substrate 100, and the first wiring layer 800, and may have a first bottom surface. The second through hole portion 92 may penetrate the dielectric layer 400, the first substrate 100, and the first wiring layer 800, and may extend into an upper portion of the second wiring layer 1800. The second through hole portion 92 may have a second bottom surface, and the second bottom surface may expose the top surface of the second conductive structure 1830. For example, the second bottom surface of the second through hole portion 92 may be lower than the first bottom surface of the first through hole portion 91. The second through hole portion 92 may have a sidewall spaced apart from that of the first through hole portion 91. The third through hole portion 93 may be provided between and connected to an upper portion of the first through hole portion 91 and an upper portion of the second through hole portion 92. The first through hole 901 may be provided therein with the first conductive pattern 911, the protective dielectric layer 471, and the first buried pattern 921. The first conductive pattern 911 may cover inner sidewalls of the first, second, and third through hole portions 91, 92, and 93.

According to the present inventive concepts, a fence pattern may include a first fence pattern and a second fence pattern. A width at a bottom surface of the first fence pattern may be less than a width at a top surface of the first fence pattern. Accordingly, an increased amount of light may be incident on photoelectric conversion regions of a substrate. An image sensor may increase in image quality.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. An image sensor, comprising:
    a substrate having a first surface and a second surface that are opposite to each other;
    a plurality of color filters on the substrate;
    a fence pattern between adjacent color filters of the plurality of color filters;
    a protective layer between the substrate and the plurality of color filters, wherein the protective layer covers the fence pattern; and
    a dielectric layer between the substrate and the color filters,
    wherein the fence pattern includes:
        a first fence pattern having a first bottom surface and a first top surface that are opposite to each other; and
        a second fence pattern on the first top surface of the first fence pattern,
    wherein the protective layer covers a sidewall of the first fence pattern,
    wherein the first fence pattern is on the dielectric layer while not penetrating the dielectric layer, and
    wherein the first bottom surface of the first fence pattern is disposed above an uppermost surface of the dielectric layer while having a width less than a width of the second fence pattern.

2. The image sensor of claim 1, wherein the width of the first bottom surface of the first fence pattern is less than a width at the top surface of the first fence pattern.

3. The image sensor of claim 1, wherein a maximum width of the second fence pattern is 100% to 102% of a minimum width of the second fence pattern.

4. The image sensor of claim 1, wherein a width at the first top surface of the first fence pattern is greater than the width of the second fence pattern.

5. The image sensor of claim 1, wherein the width at the first bottom surface of the first fence pattern is less than a width at the first top surface of the first fence pattern.

6. The image sensor of claim 1, wherein the first fence pattern includes a lower portion, an upper portion, and a middle portion between the lower portion and the upper portion, and
    wherein a width at the middle portion of the first fence pattern is less than the width at the first bottom surface of the first fence pattern.

7. The image sensor of claim 1, wherein the protective layer covers a portion of the first top surface of the first fence pattern.

8. The image sensor of claim 1, further comprising a microlens layer on the color filters and the fence pattern,
    wherein the second fence pattern has a second bottom surface and a second top surface that are opposite to each other, and
    wherein the protective layer is between the microlens layer and the second top surface of the second fence pattern.

9. The image sensor of claim 1, wherein
    each color filter of the plurality of color filters is provided on a corresponding sidewall of the fence pattern, and
    at least a portion of a top surface of the second fence pattern is not covered with the color filters.

10. The image sensor of claim 1, further comprising a pixel separation pattern in the substrate, wherein the pixel separation pattern defines a plurality of pixel regions, and
    wherein the fence pattern overlaps the pixel separation pattern.

11. An image sensor, comprising:
    a substrate having a first surface and a second surface that are opposite to each other, wherein the substrate includes a plurality of photoelectric conversion regions;
    a separation pattern in the substrate and between the photoelectric conversion regions;
    a plurality of color filters on the substrate;
    a fence pattern on the separation pattern and between adjacent color filters of the plurality of color filters; and
    a dielectric layer between the separation pattern and the fence pattern, wherein the fence pattern includes:
a first fence pattern having a bottom surface and a top surface that are opposite to each other; and
a second fence pattern on the first fence pattern,
wherein the bottom surface of the first fence pattern is disposed above an uppermost surface of the dielectric layer while having a width less than a width at the top surface of the first fence pattern, and
wherein a maximum width of the second fence pattern is about 100% to about 102% of a minimum width of the second fence pattern, wherein the bottom surface of the first fence pattern is disposed above an uppermost surface of the dielectric layer.

12. The image sensor of claim 11, wherein the second fence pattern includes a material different from a material of the first fence pattern.

13. The image sensor of claim 12, wherein
the first fence pattern includes metal, and
the second fence pattern includes a polymer structure and a plurality of nano-particles in the polymer structure.

14. The image sensor of claim 11, further comprising a protective layer between the substrate and the color filters, wherein the protective layer covers the fence pattern, and
wherein the protective layer covers a sidewall of the first fence pattern.

15. The image sensor of claim 14, wherein
the dielectric layer is disposed between the substrate and the color filters,
wherein the image sensor further comprises a microlens layer on the color filters and the fence pattern,
wherein the microlens layers the protective layer.

16. The image sensor of claim 11, wherein a height of the second fence pattern is greater than a height of the first fence pattern.

17. An image sensor, comprising:
a substrate having a first surface and a second surface that are opposite to each other, wherein the substrate includes therein a plurality of photoelectric conversion regions;
a separation pattern in the substrate and between adjacent photoelectric conversion regions of the plurality of photoelectric conversion regions;
a plurality of color filters on the substrate;
a fence pattern on the separation pattern and between adjacent color filters of the plurality of color filters, wherein the fence pattern includes:
a first fence pattern having a first bottom surface and a first top surface that are opposite to each other; and
a second fence pattern on the first top surface of the first fence pattern,
wherein the first bottom surface of the first fence pattern is disposed above an uppermost surface of the dielectric layer while having a width less than a width of the second fence pattern;
a dielectric layer between the substrate and the color filters and between the fence pattern and the separation pattern;
a protective layer between the dielectric layer and the color filters, wherein the protective layer covers a sidewall of the first fence pattern, a sidewall of the second fence pattern; and a top surface of the second fence pattern;
a microlens layer on the color filters and the fence pattern;
a gate pattern on the second surface of the substrate; and
a wiring layer on the second surface of the substrate, wherein the wiring layer includes a lower dielectric layer and a wiring structure,
wherein the lower dielectric layer covers the gate pattern, and
wherein the wiring structure is in the lower dielectric layer.

18. The image sensor of claim 17, wherein the second fence pattern includes a second bottom surface and a second top surface that are opposite to each other, and
wherein a width at the second top surface of the second fence pattern is substantially the same as a width at the second bottom surface of the second fence pattern.

19. The image sensor of claim 17, wherein
the width at the first bottom surface of the first fence pattern is in a range of about 45 nm to about 55 nm, and
a width of the second fence pattern is in a range of about 72 nm to about 88 urn.

20. The image sensor of claim 17, wherein the dielectric layer includes:
a first dielectric layer on the substrate and including metal oxide or metal fluoride;
a second dielectric layer on the first dielectric layer and including metal oxide, wherein the second dielectric layer includes a material different from a material of the first dielectric layer;
a third dielectric layer on the second dielectric layer and including a first silicon-based dielectric material;
a fourth dielectric layer on the third dielectric layer and including a second silicon-based dielectric material different from the first silicon-based dielectric material; and
a fifth dielectric layer between the fourth dielectric layer and the first fence pattern and including metal oxide.

* * * * *